(12) United States Patent
Tabata et al.

(10) Patent No.: US 8,430,468 B2
(45) Date of Patent: *Apr. 30, 2013

(54) HEAD DRIVE DEVICE OF INKJET PRINTER AND INKJET PRINTER

(75) Inventors: Kunio Tabata, Shiojiri (JP); Toshiyuki Suzuki, Shiojiri (JP); Osamu Shinkawa, Chino (JP); Tomoki Hatano, Higashiomi (JP); Atsushi Oshima, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/333,648

(22) Filed: Dec. 21, 2011

(65) Prior Publication Data

US 2012/0092401 A1 Apr. 19, 2012

Related U.S. Application Data

(63) Continuation of application No. 12/161,148, filed as application No. PCT/JP2007/050608 on Jan. 17, 2007.

(30) Foreign Application Priority Data

Jan. 17, 2006 (JP) ................................. 2006-009251

(51) Int. Cl.
*B41J 29/38* (2006.01)
*B41J 2/05* (2006.01)

(52) U.S. Cl.
USPC .................................. 347/10; 347/9; 347/57

(58) Field of Classification Search ................ 347/9, 10, 347/11, 14, 57
See application file for complete search history.

(56) References Cited

U.S. PATENT DOCUMENTS

| 2,915,589 | A | 12/1959 | Plant |
| 4,254,439 | A | 3/1981 | Fowler et al. |
| 4,992,749 | A | 2/1991 | Tokumo et al. |
| 5,262,733 | A | 11/1993 | Nakajima et al. |
| 5,283,658 | A | 2/1994 | Hayashi et al. |

(Continued)

FOREIGN PATENT DOCUMENTS

| EP | 1594224 | 11/2005 |
| JP | 63-247059 | 10/1988 |

(Continued)

OTHER PUBLICATIONS

Japanese Office Action dated Jan. 17, 2012, cited in Japanese Application No. 2007-184438.

(Continued)

*Primary Examiner* — Jannelle M Lebron
(74) *Attorney, Agent, or Firm* — Workman Nydegger

(57) ABSTRACT

A head drive of an inkjet printer includes nozzles and corresponding actuators that eject liquid ink drops. A drive unit applies a drive signal to the actuators. The drive unit includes a drive waveform generator that generates a drive waveform signal to control the drive of the actuators. A modulator pulse modulates the drive waveform. A digital power amplifier amplifies power of the modulated signal. A low pass filter smoothes the amplified digital signal and supplies the signal as a drive signal to the actuators. An inverse filter provided in a subsequent stage of the drive waveform generator corrects at least the frequency characteristics of the filter to predetermined frequency characteristics, independent of the number of the actuators to drive.

3 Claims, 16 Drawing Sheets

U.S. PATENT DOCUMENTS

| | | | |
|---|---|---|---|
| 5,406,314 | A | 4/1995 | Kuehnie |
| 5,475,405 | A | 12/1995 | Widder et al. |
| 5,675,296 | A | 10/1997 | Tomikawa |
| 5,894,314 | A | 4/1999 | Tajika et al. |
| 6,133,844 | A | 10/2000 | Ahne et al. |
| 6,267,519 | B1 | 7/2001 | Otsuki et al. |
| 6,312,076 | B1 | 11/2001 | Taki et al. |
| 6,312,096 | B1 | 11/2001 | Koitabashi et al. |
| 6,320,605 | B1 | 11/2001 | Ikeda et al. |
| 6,344,811 | B1 | 2/2002 | Melanson |
| 6,364,443 | B1 | 4/2002 | Katano et al. |
| 6,378,996 | B1 | 4/2002 | Shimada |
| 6,431,676 | B2 | 8/2002 | Asauchi |
| 6,443,547 | B1 | 9/2002 | Takahashi |
| 6,454,377 | B1 | 9/2002 | Ishizaki |
| 6,457,794 | B1 | 10/2002 | Tajika et al. |
| 6,474,762 | B2 | 11/2002 | Taki et al. |
| 6,502,930 | B1 | 1/2003 | Shimada |
| 6,582,043 | B2 | 6/2003 | Ishizaki |
| 6,652,055 | B2 | 11/2003 | Oikawa |
| 6,739,686 | B2 | 5/2004 | Imai |
| 6,776,469 | B2 | 8/2004 | Nozawa |
| 6,929,340 | B2 | 8/2005 | Ishizaki |
| 7,038,534 | B2 | 5/2006 | Hanzlik |
| 7,083,274 | B2 | 8/2006 | Morita |
| 7,084,996 | B2 | 8/2006 | Kubo |
| 7,111,755 | B2 | 9/2006 | Koyama et al. |
| 7,170,544 | B2 | 1/2007 | Horiuchi |
| 7,239,200 | B2 | 7/2007 | Ishii et al. |
| 7,244,007 | B2 | 7/2007 | Ishizaki |
| 7,252,355 | B2 | 8/2007 | Umeda |
| 7,357,496 | B2 | 4/2008 | Silverbrook |
| 7,384,128 | B2 | 6/2008 | Sheahan et al. |
| 7,571,989 | B2 | 8/2009 | Ishizaki |
| 7,581,802 | B2 | 9/2009 | Tabata et al. |
| 7,585,037 | B2 | 9/2009 | Tabata et al. |
| 7,717,530 | B2 | 5/2010 | Oshima |
| 7,731,317 | B2 | 6/2010 | Oshima |
| 7,748,812 | B2 | 7/2010 | Oshima |
| 7,758,140 | B2 | 7/2010 | Oshima et al. |
| 7,880,539 | B2 * | 2/2011 | Tabata et al. ............ 347/10 |
| 8,262,181 | B2 * | 9/2012 | Oshima ................... 347/10 |
| 8,262,183 | B2 * | 9/2012 | Oshima et al. .......... 347/10 |
| 2001/0040595 | A1 | 11/2001 | Taki et al. |
| 2002/0018085 | A1 | 2/2002 | Asauchi et al. |
| 2002/0113832 | A1 | 8/2002 | Kanematsu |
| 2002/0142733 | A1 | 10/2002 | Nishinakagawa |
| 2002/0163458 | A1 | 11/2002 | Jin |
| 2003/0112297 | A1 | 6/2003 | Hiratsuka et al. |
| 2003/0231179 | A1 | 12/2003 | Suzuki |
| 2004/0047477 | A1 | 3/2004 | Bank |
| 2004/0119770 | A1 | 6/2004 | Tamura |
| 2004/0227807 | A1 | 11/2004 | Horiuchi |
| 2004/0233241 | A1 | 11/2004 | Salacz |
| 2005/0116977 | A1 | 6/2005 | Shinkawa |
| 2005/0231179 | A1 | 10/2005 | Ishizaki |
| 2005/0248399 | A1 | 11/2005 | Kurokawa |
| 2006/0132231 | A1 | 6/2006 | Ishii et al. |
| 2006/0181342 | A1 | 8/2006 | Kanoh |
| 2007/0079710 | A1 | 4/2007 | Ishizaki |
| 2007/0120938 | A1 | 5/2007 | Fitzpatrick et al. |
| 2007/0126845 | A1 | 6/2007 | Silverbrook et al. |
| 2007/0165074 | A1 | 7/2007 | Ishizaki |
| 2008/0018683 | A1 | 1/2008 | Oshima et al. |
| 2008/0018686 | A1 | 1/2008 | Oshima et al. |
| 2008/0100652 | A1 | 5/2008 | Oshima et al. |
| 2008/0186350 | A1 | 8/2008 | Oshima et al. |
| 2008/0198191 | A1 | 8/2008 | Oshima |
| 2009/0033698 | A1 | 2/2009 | Suzuki et al. |
| 2009/0066739 | A1 | 3/2009 | Tabata et al. |
| 2009/0140780 | A1 | 6/2009 | Miyazaki et al. |
| 2009/0213152 | A1 | 8/2009 | Tabata et al. |
| 2009/0267979 | A1 | 10/2009 | Tabata et al. |
| 2009/0289980 | A1 | 11/2009 | Tabata et al. |
| 2009/0303271 | A1 | 12/2009 | Tabata et al. |
| 2010/0091059 | A1 | 4/2010 | Oshima et al. |
| 2010/0097419 | A1 | 4/2010 | Oshima |
| 2010/0118078 | A1 | 5/2010 | Oshima et al. |
| 2010/0188452 | A1 | 7/2010 | Oshima |
| 2010/0220133 | A1 | 9/2010 | Oshima et al. |
| 2011/0102486 | A1 | 5/2011 | Tabata |
| 2011/0109674 | A1 | 5/2011 | Oshima et al. |

FOREIGN PATENT DOCUMENTS

| | | |
|---|---|---|
| JP | 02-262705 | 10/1990 |
| JP | 03-147446 A | 6/1991 |
| JP | 05-077456 | 3/1993 |
| JP | 05-199044 | 8/1993 |
| JP | 06-041208 | 6/1994 |
| JP | 09-234865 | 9/1997 |
| JP | 09-300618 | 11/1997 |
| JP | 09-308264 | 11/1997 |
| JP | 10-081013 | 3/1998 |
| JP | 10-210757 | 8/1998 |
| JP | 11-058733 A | 3/1999 |
| JP | 11-204850 | 7/1999 |
| JP | 11-204850 A | 7/1999 |
| JP | 2000-117980 A | 4/2000 |
| JP | 2000-238262 | 9/2000 |
| JP | 2000-245162 | 9/2000 |
| JP | 2001-121697 | 5/2001 |
| JP | 2001-138515 | 5/2001 |
| JP | 2001-162794 | 6/2001 |
| JP | 2001-268922 | 9/2001 |
| JP | 2002-019106 | 1/2002 |
| JP | 2002-204595 | 7/2002 |
| JP | 2002-210958 A | 7/2002 |
| JP | 2002-536903 A | 10/2002 |
| JP | 2003-001824 | 1/2003 |
| JP | 2003-237068 | 8/2003 |
| JP | 2004-048886 | 2/2004 |
| JP | 2004-306434 | 11/2004 |
| JP | 2005-035062 | 2/2005 |
| JP | 2005-065068 | 3/2005 |
| JP | 2005-075475 | 3/2005 |
| JP | 2005-094611 | 4/2005 |
| JP | 2005-131928 | 5/2005 |
| JP | 2005-322957 | 11/2005 |
| JP | 2005-329710 | 12/2005 |
| JP | 2005-349576 | 12/2005 |
| JP | 2006-025151 | 1/2006 |
| JP | 2006-304490 | 2/2006 |
| JP | 2006-231882 | 9/2006 |
| JP | 2006-256151 | 9/2006 |
| JP | 2006-272907 | 10/2006 |
| JP | 2007-069555 | 3/2007 |
| JP | 2007-096364 | 4/2007 |
| JP | 2007-144867 | 6/2007 |
| JP | 2007-168172 | 7/2007 |
| JP | 2007-190708 | 8/2007 |
| JP | 2008-049698 | 3/2008 |
| JP | 2008-049699 | 3/2008 |
| JP | 2008-087467 | 4/2008 |

OTHER PUBLICATIONS

Japanese Office Action dated Nov. 1, 2011, cited in Japanese Application No. 2007-181649.
U.S. Appl. No. 12/389,525, Jan. 9, 2012, Office Action.
U.S. Appl. No. 12/161,201, Jan. 13, 2012, Notice of Allowance.
2007-555945, Feb. 14, 2012, Japanese Office Action.
2007-184439, Feb. 14, 2012, Japanese Office Action.
2011-177064, Mar. 21, 2012, Japanese Office Action.
European Search Report and Written Opinion cited in European Patent Application No. 07706915.1 mailed Jan. 28, 2010.
Japanese Office Action dated May 24, 2011 cited in Application No. JP 2007-551164.
Japanese Office Action dated May 31, 2011 cited in Application No. JP 2007-555945.
Japanese Office Action dated Nov. 1, 2011 cited in Application No. JP 2007-181649.
U.S. Appl. No. 11/780,301, Jun. 27, 2008, Office Action.
U.S. Appl. No. 11/780,301, Feb. 20, 2009, Final Office Action.
U.S. Appl. No. 11/780,301, Jun. 16, 2009, Notice of Allowance.
U.S. Appl. No. 11/780,357, Oct. 28, 2009, Office Action.

U.S. Appl. No. 11/780,357, May 12, 2010, Final Office Action.
U.S. Appl. No. 11/780,357, Mar. 4, 2011, Office Action.
U.S. Appl. No. 11/780,379, Mar. 3, 2010, Office Action.
U.S. Appl. No. 11/780,379, Aug. 20, 2010, Final Office Action.
U.S. Appl. No. 11/780,379, Mar. 4, 2011, Office Action.
U.S. Appl. No. 11/780,390, Apr. 8, 2009, Notice of Allowance.
U.S. Appl. No. 11/849,582, May 28, 2008, Office Action.
U.S. Appl. No. 11/849,582, Dec. 30, 2009, Final Office Action.
U.S. Appl. No. 11/849,582, Apr. 19, 2010, Notice of Allowance.
U.S. Appl. No. 11/923,448, Nov. 27, 2009, Office Action.
U.S. Appl. No. 11/923,448, Apr. 28, 2010, Final Office Action.
U.S. Appl. No. 11/972,542, Apr. 5, 2010, Notice of Allowance.
U.S. Appl. No. 12/161,148, Mar. 30, 2010, Office Action.
U.S. Appl. No. 12/161,148, Sep. 16, 2010, Final Office Action.
U.S. Appl. No. 12/161,148, Mar. 21, 2011, Office Action.
U.S. Appl. No. 12/161,148, Sep. 2, 2011, Notice of Allowance.
U.S. Appl. No. 12/161,148, Oct. 11, 2011, Supplemental Notice of Allowance.
U.S. Appl. No. 12/161,201, Sep. 28, 2010, Office Action.
U.S. Appl. No. 12/161,201, Apr. 14, 2011, Final Office Action.
U.S. Appl. No. 12/161,201, Aug. 8, 2011, Notice of Allowance.
U.S. Appl. No. 12/340,940, Apr. 12, 2010, Notice of Allowance.
U.S. Appl. No. 12/351,472, Jan. 4, 2010, Notice of Allowance.
U.S. Appl. No. 12/509,915, Sep. 30, 2010, Office Action.
U.S. Appl. No. 12/637,412, Aug. 23, 2010, Office Action.
U.S. Appl. No. 12/637,412, Jun. 14, 2011, Notice of Allowance.
U.S. Appl. No. 12/752,367, Oct. 8, 2010, Office Action.
U.S. Appl. No. 12/689,926, Nov. 30, 2010, Office Action.
U.S. Appl. No. 12/498,296, Dec. 17, 2010, Notice of Allowance.
U.S. Appl. No. 12/027,175, Dec. 27, 2010, Office Action.
U.S. Appl. No. 12/027,175, Jun. 15, 2011, Office Action.
U.S. Appl. No. 12/026,129, Dec. 27, 2010, Office Action.
U.S. Appl. No. 12/026,129, Jun. 14, 2011, Office Action.
U.S. Appl. No. 12/624,206, Oct. 11, 2011, Office Action.
U.S. Appl. No. 12/158,591, Oct. 27, 2011, Office Action.
U.S. Appl. No. 12/637,412, Nov. 25, 2011, Notice of Allowance.

* cited by examiner

: NO NOZZLES

: ONE NOZZLE

: N NOZZLES

FREQUENCY

HEAD DRIVE DEVICE OF INKJET PRINTER AND INKJET PRINTER

This application is a Continuation of U.S. patent application Ser. No. 12/161,148 filed on Jul. 16, 2008 which is a 371 of PCT/JP2007-050608 filed Jan. 17, 2007 which claims priority to Japanese Patent Application No. 2006-009251, filed Jan. 17, 2006 which applications are expressly incorporated herein by reference.

BACKGROUND

1. Technical Field

The present invention relates to an ink jet printer in which a plurality of nozzles jet minute ink drops of a plurality of colors and in which particles of ink (ink dots) are formed on a print medium to draw pre-determined characters and images.

2. Related Art

An ink jet printer generally provides low-cost and high-quality color printed material. As such, ink jet printers are widely used not only in offices but also by personal users due to the popularization of personal computers and digital cameras.

Generally, in ink jet printers, a moving part called a carriage, comprising ink cartridges and print heads, moves back and forth over a print medium in a direction perpendicular to the direction of the movement of the print medium while nozzles of the print head eject ink drops to form ink dots on the print medium. In this manner, pre-determined characters or images are drawn on the print medium to create the desired printed material. The carriage comprises ink cartridges for four colors including black yellow, magenta and cyan and a print head for each of the colors, so that not only monochrome print but also full color print in any combination of the respective colors can be easily performed. Print in six colors, including the colors light cyan and light magenta, seven colors and eight colors are also implemented.

In the ink jet printer described above, printing by moving the ink jet heads on the carriage back and forth in a direction perpendicular to the direction of the movement of the print medium, the ink jet heads must be moved back and forth approximately ten times or more to print a whole page. Therefore, it has the drawback of taking a longer time for printing than a print apparatus using another scheme; for example, a laser printer or a copying machine using an electrographic technique.

On the other hand, in an ink jet printer comprising ink jet heads (which may or may not be integrated) of the same length as the width of the print medium but not within a carriage, the ink jet heads do not need to be moved back and forth over the print medium, which enables quicker one-pass printing similar to the speed of a laser printer. An ink jet printer in the former scheme is generally called a "multi-pass (serial) ink jet printer", while an ink jet printer in the latter scheme is generally called a "line head ink jet printer".

The above types of ink jet printers are required to provide higher gradation. Gradation is the density of each color included in a pixel represented by an ink dot. The size of an ink dot depends on the density of a color of each pixel is called gradient, while the number of gradients represented by an ink dot is called the number of gradations. High gradation means that the number of gradations is large. To change gradient, it is necessary to change a drive pulse to an actuator provided for an ink jet head. For example, if an actuator is a piezoelectric element, when a voltage value applied to the piezoelectric element is large, the magnitude of displacement (distortion) of the piezoelectric element (precisely, a vibrating plate) is also large. This is used to change the gradient of an ink dot.

According to JP-A-10-81013, a plurality of drive pulses having different voltage peak values are combined and coupled to generate a drive signal. The signal is output to piezoelectric elements of nozzles for the same color provided for an ink jet head. According to the drive signal, a drive pulse for the gradient of an ink dot to be formed is selected for each nozzle. The selected drive pulse is supplied to a piezoelectric element of an appropriate nozzle to jet an ink drop. In this manner, the requested gradient of an ink dot is achieved.

A method of generating a drive signal (or drive pulse) is illustrated in FIG. 2 of JP-A-2004-306434. According to this method, data is read out from a memory for storing drive signal data, a D/A converter converts the data into analog data, and a drive signal is supplied to an ink jet head through a current amplifier. A current amplifier circuit comprises transistors in push-pull connection, as shown in FIG. 3 of the document, in which a linear drive amplifies a drive signal. However, in a current amplifier with such configuration, a linear drive itself of a transistor is inefficient. Moreover, such an amplifier has the drawback of large circuit size since the transistor itself should be large for a countermeasure against heat, or the transistor needs a cooling plate radiator. Particularly, the large size of the cooling plate radiator is a major obstacle to the layout.

To resolve the drawback, JP-A-2005-35062 discloses an ink jet printer for generating a drive signal by controlling the reference voltage of a DC/DC converter. According to the document, an efficient DC/DC converter is used to dispense with a radiating unit for cooling. Additionally, a PWM signal is used so that a D/A converter can be realized using a simple low-pass filter. These can be realized in a small circuit.

However, a DC/DC converter is designed to generate a constant voltage. As such, the head drive apparatus of an ink jet printer using the DC/DC converter in JP-A-2005-35062 has a problem in that in a waveform, for example, the necessary rapid rise and fall of a drive signal cannot be obtained for an ink jet head to jet ink drops well. Of course, the head drive apparatus of an ink jet printer in which a pair of transistors in push-pull connection amplifies the current of an actuator drive signal in JP-A-2004-306434 has the problem that a cooling plate radiator is so large that it cannot be actually laid out; particularly in a line head ink jet printer having a large number of nozzles, and as a result, a large number of actuators.

SUMMARY

An object of the present invention is to provide a head drive apparatus of an inkjet printer that enables rapid rise and fall of a drive signal to an actuator, does not require a cooling unit such as a cooling plate radiator, and can inhibit or prevent distortion of a drive signal.

To solve the above problems, a head drive apparatus of an inkjet printer according to a first aspect of the present invention includes a plurality of nozzles for jetting liquid drops The head drive apparatus further includes actuators corresponding to the nozzles. The head drive apparatus further includes a drive unit that applies a drive signal to the actuators. The drive unit includes a drive waveform generator that generates a drive waveform signal to control the drive of the actuators, a modulator that pulse modulates the drive waveform signal, a digital power amplifier for amplifying the power of the modulated signal, a low pass filter for smoothing the amplified digital signal and supplying the signal as a drive signal to the actuators, and an inverse filter that corrects at least the frequency characteristics of the filter comprised of the capacitance of the low pass filter and the capacitance of the actuators to predetermined frequency characteristics, independent of the number of the actuators to drive.

In the head drive of an inkjet printer according to the first aspect, the drive waveform generator generates a drive waveform signal to control the drive of the actuators, the modulator modulates a pulse of the generated drive waveform signal, the digital power amplifier amplifies the power of the modulated signal, and the low pass filter smoothes the amplified digital signal and supplies the signal as a drive signal to the actuator. Thus, filter characteristics of the low pass filter are set to sufficiently smooth only the amplified digital signal component so that rapid rise and fall of a drive signal to the actuators are enabled and the digital power amplifier can efficiently amplify the power of a drive signal. This dispenses with a cooling unit such as a cooling plate radiator.

In addition, an inverse filter, that corrects at least the frequency characteristics of the filter including the capacitance of the low pass filter and the capacitance of the actuators to predetermined frequency characteristics, independent of the number of the actuators to drive, is provided. Therefore, among the drive waveform signal components, the component which is changed by the low pass filter by the capacitance of the low pass filter and the capacitance of the actuator can be emphasized or attenuated so that the distortion of a drive signal which is actually applied to the actuator can be inhibited or prevented.

A head drive apparatus of an inkjet printer according to a second aspect of the present invention includes the head drive of an inkjet printer according to the first aspect discussed above where the frequency characteristics of the inverse filter are set as a function of the number of actuators.

According to a head drive of an inkjet printer of the second aspect of the present invention, the frequency characteristics of the inverse filter are set as a function of the number of actuators. Therefore, a component which changes as a function of the number of the connected actuators can be accurately emphasized or attenuated, so that the distortion of a drive signal which is actually applied to the actuator can be further inhibited or prevented.

A head drive of an inkjet printer according to a third aspect of the present invention includes the head drive of an inkjet printer according to the second aspect where, when the number of the actuators exceeds a predetermined value, a high frequency emphasis filter is used and when the number of the actuators is less than a predetermined value, a low-pass or high frequency attenuation filter is used.

According to a head drive of an inkjet printer of the third aspect of the present invention, the head drive is configured so that when the number of the actuators exceeds a predetermined value, a high frequency emphasis filter is used, and when the number of the actuators is less than a predetermined value, a low-pass or high frequency attenuation filter is used. Therefore, among the drive waveform signal components, a component which is changed by a filter having a capacitance of the low pass filter and the actuator can more appropriately be emphasized or attenuated, so that the distortion of a drive signal which is actually applied to the actuator can be appropriately inhibited or prevented.

DETAILED DESCRIPTION OF THE PREFERRED EMBODIMENTS

A first embodiment of an inkjet printer according to the present invention will be described with reference to the drawings.

Figure 1A:
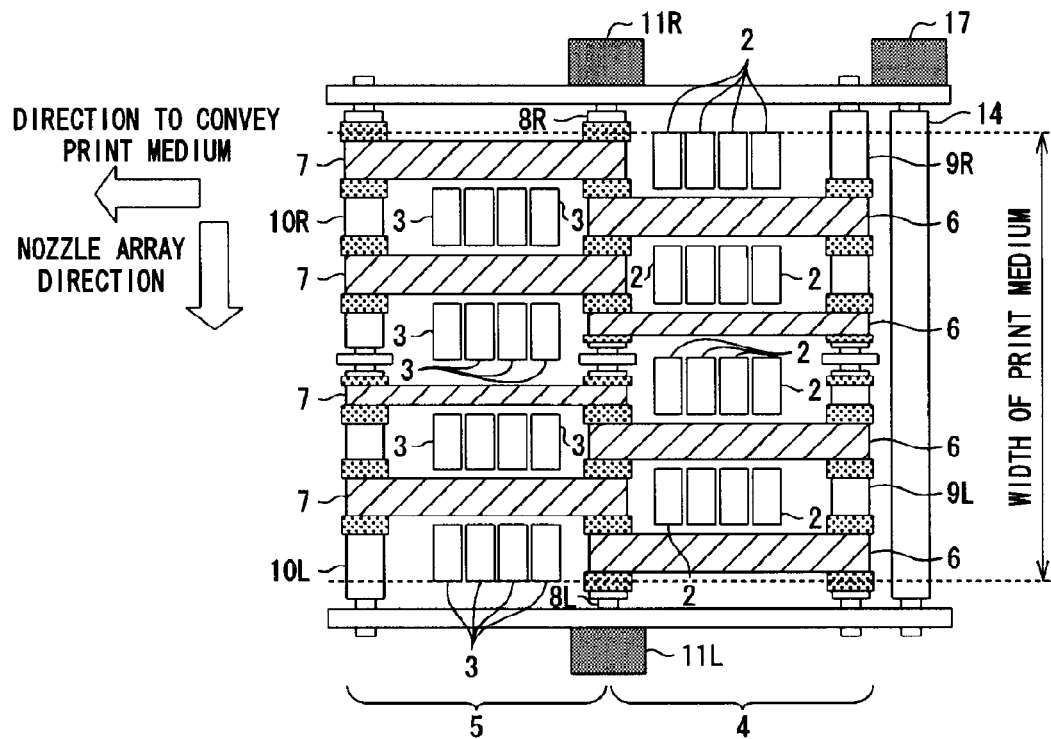
FIG. 1A is a top view of the overall configuration showing a first embodiment of a line head ink jet printer to which a head drive apparatus of the ink jet printer according to the present invention is applied.
Figure 1B:
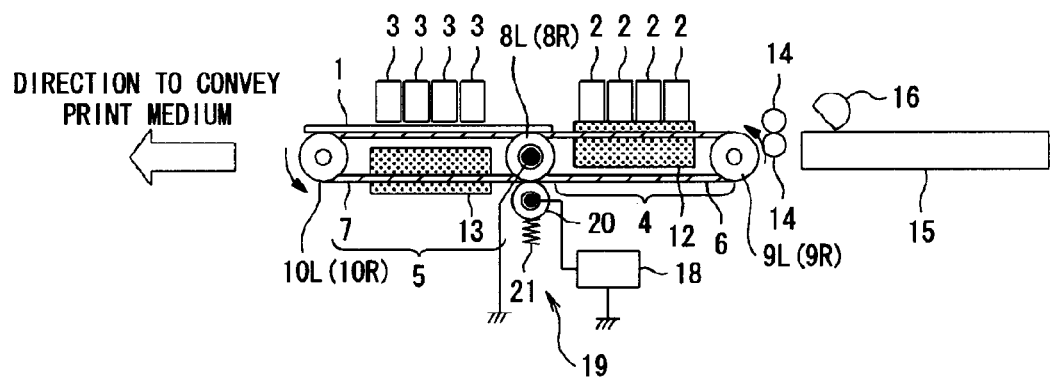
FIG. 1B is a front view of the line head ink jet printer of FIG. 1A.

FIGS. 1A and 1B are the overall configuration diagrams of an inkjet printer according to this embodiment: FIG. 1A is a top plain view of the printer; and FIG. 1B is a front view of the printer. In FIGS. 1A and 1B, a print medium 1, in a line head inkjet printer, is conveyed in a direction from the right to the left indicated by the arrow drawn in FIGS. 1A and 1B, and printed in a printing area. However, the inkjet head according to the present embodiment is not arranged only in one line, but two lines of inkjet heads are provided.

A first line of inkjet heads 2 are provided on the "upstream" side of the direction in which the print medium 1 is conveyed, and a second line of inkjet heads 3 are provided on the "downstream" side. A first conveyor unit 4 that carries the print medium 1 is provided below the first inkjet heads 2, while a second conveyor unit 5 is provided below the second inkjet heads 3. The first conveyor unit 4 includes four first conveyor belts 6 which are arranged with predetermined space therebetween in the direction perpendicular to the conveyance of the print medium 1 (hereinafter, also referred to as the nozzle array direction), and the second conveyor unit 5 similarly includes four second conveyor belts 7 which are arranged with predetermined space therebetween in the nozzle array direction.

The four first conveyor belts 6 and the four second conveyor belts 7 are arranged alternately. This embodiment divides the conveyor belts into two of the first conveyor belts 6 and two of the second conveyor belts 7 on the left side in the nozzle array direction, and two of the first conveyor belts 6 and two of the second conveyor belts 7 on the right side in the nozzle array direction. That is, a right drive roller 8R is provided through an overlapping part of the two first conveyor belts 6 and the two second conveyor belts 7 on the right side in the nozzle array direction. A left drive roller 8L is provided through an overlapping part of the two first conveyor belts 6 and the two second conveyor belts 7 on the left side in the nozzle array direction. A first right driven roller 9R and a first left driven roller 9L are provided on the upstream side, while a second right driven roller 10R and a second left driven roller 10L are provided on the downstream side. The rollers are practically separated at the center part of FIG. 1A, though they individually seem to be continuous rollers. The two first conveyor belts 6 on the right side in the nozzle array direction are wound around the right drive roller 8R and the first right driven roller 9R, and the two first conveyor belts 6 on the left side in the nozzle array direction are wound around the left drive roller 8L and the first left driven roller 9L. The two second conveyor belts 7 on the right side in the nozzle array direction are wound around the right drive roller 8R and the second right driven roller 10R, and the two second conveyor belts 7 on the left side in the nozzle array direction are wound around the left drive roller 8L and the second left driven roller 10L. The right drive roller 8R is connected to the right electric motor 11R, and the left drive roller 8L is connected to the left electric motor 11L. Therefore, when the right electric motor 11R rotates the right drive roller 8R, the first conveyor unit 4 having the two first conveyor belts 6 on the right side in the nozzle array direction and the second conveyor unit 5 similarly having the two second conveyor belts 7 on the right side in the nozzle array direction synchronize with each other and move at the same speed. When the left electric motor 11L rotates the left drive roller 8L, the first conveyor unit 4 having the two first conveyor belts 6 on the left side in the nozzle array direction and the second conveyor unit 5 similarly having the two second conveyor belts 7 on the left side in the nozzle array direction synchronize with each other and move at the same speed. However, if the right electric motor 11R and the left electric motor 11L rotate at different speeds, conveyor speeds on left and right sides in the nozzle array direction can be different from each other. Specifically, if the right electric motor 11R rotates faster than the left electric motor 11L, the conveyor speed of the right side in the nozzle array direction can be higher than that of the left side. If the left electric motor 11L rotates faster than the right electric motor 11R, the conveyor speed of the left side in the nozzle array direction can be higher than that of the right side.

The first inkjet heads 2 and the second inkjet heads 3 are arranged offset from each other in the direction in which the print medium 1 is conveyed for each of four colors of yellow (Y), magenta (M), cyan (C) and black (K). To the respective inkjet heads 2 and 3, ink is supplied from ink tanks (not shown) for the respective colors via ink supply tubes. Each of the inkjet heads 2 and 3 has a plurality of nozzles formed therein in the direction crossing the direction in which the print medium 1 is conveyed (i.e., the nozzle array direction). The nozzles simultaneously jet the necessary amount of ink drops to the necessary position to form and output minute ink dots on the print medium 1. This is performed for each color so that only one pass of the print medium 1 conveyed by the first conveyor unit 4 and the second conveyor unit 5 is required, thus enabling one-pass printing thereon. That is, the areas where the inkjet heads 2 and 3 are arranged correspond to the printing area.

A method for jetting and outputting ink from each nozzle of an inkjet head includes an electrostatic scheme, a piezoelectric inkjet, and a film-boiling ink jet. In the electrostatic scheme, an application of a drive signal to an electrostatic gap which functions as an actuator causes a displacement of a vibrating plate in a cavity and a pressure change in the cavity, which causes ink drops to be jetted and output from a nozzle. In the piezoelectric inkjet, an application of a drive signal to a piezoelectric element which functions as an actuator causes a displacement of a vibrating plate in a cavity and a pressure change in the cavity, which causes ink drops to be jetted and output from a nozzle. In the film-boiling ink jet, a micro heater in a cavity is instantaneously heated to a temperature of 300 degrees C. or more, so as to cause boiling of the ink and generate bubbles in the ink, resulting in a pressure change which causes ink drops to be jetted and output from a nozzle. The present invention can be applied to any of the above ink output methods, but among them, is particularly preferable to a piezoelectric element since the amount of ink drop ejection can be adjusted by controlling the peak voltage or the voltage gradient of the drive signal.

The ink drop jetting nozzles of the first inkjet heads 2 are formed only between the four first conveyor belts 6 of the first conveyor unit 4, while the ink drop jetting nozzles of the second inkjet heads 3 are formed only between the four second conveyor belts 7 of the second conveyor unit 5. This allows a cleaning unit which will be described below to clean the respective inkjet heads 2 and 3. However, in this configuration, one-pass full-page printing cannot be accomplished by either of the inkjet heads independently. Accordingly, in order to cover the areas where either of the inkjet heads cannot print independent of one another, the first inkjet heads 2 and the second inkjet heads 3 are arranged offset from each other in the direction in which the print medium 1 is conveyed.

A first cleaning cap 12 for cleaning the first inkjet heads 2 is provided under the first inkjet heads 2, while a second cleaning cap 13 for cleaning the second inkjet heads 3 is provided under the second inkjet heads 3. Both of the cleaning caps 12 and 13 are formed to have a size which passes between the four first conveyor belts 6 of the first conveyor unit 4 and between the four second conveyor belts 7 of the second conveyor unit 5, respectively. The cleaning caps 12 and 13 individually include: a square cap body with a top that covers the nozzles formed in the bottom surfaces of the inkjet heads 2 and 3, i.e., the nozzle side surface, and can be adhered to the nozzle side surface; an ink absorber provided on the bottom thereof; a tube pump connected to the bottom of the cap body; and an elevator for moving up and down the cap body. Thus, the elevator moves up the cap body to adhere the body to each nozzle side surface of the inkjet heads 2 and 3. When the tube pump creates a negative pressure in the cap body ink drops and bubbles are sucked through the nozzles which are open in the nozzle surface of the inkjet heads 2 and 3, which cleans the inkjet heads 2 or 3. When the cleaning is finished, the cleaning caps 12 and 13 are moved down.

On the upstream side of the first driven rollers 9R and 9L, a pair of gate rollers 14 are provided for controlling timing to feed the print medium 1 supplied from a paper feeder 15 and for correcting the skew of the print medium 1. The skew is torsion of the print medium 1 relative to the conveyor direction. A pickup roller 16 for supplying the print medium 1 is provided above the paper feeder 15. A gate roller motor 17 is provided for driving the gate rollers 14.

A belt charging unit 19 is provided below the drive rollers 8R and 8L. The belt charging unit 19 includes: a charging roller 20 contacting the first conveyor belts 6 and the second conveyor belts 7 across the drive rollers 8R and 8L; a spring 21 for pressing the charging roller 20 against the first conveyor belts 6 and the second conveyor belts 7; and a power source 18 for imparting electric charge to the charging roller 20, which, in turn, imparts electric charge to the first conveyor belts 6 and the second conveyor belts 7. Generally, when such a belt type, which includes a medium or high resistor or insulator, is charged by the belt charging unit 19, the electric charge induces polarization to the print medium 1 which also includes a high resistor or insulator. The electrostatic force between electric charge generated by the induced polarization and electric charge of the belt surface allows the print medium 1 to be adhered to the belt. The charging unit 19 may be a corotron, which sprays charge.

Therefore, the belt charging unit 19 charges the surfaces of the first conveyor belts 6 and the second conveyor belts 7, and in the state, the gate rollers 14 feeds the print medium 1 to be pressed against the first conveyor belt 6 by a paper pressing roller which is configured with a spur or a roller (not shown). Then, the print medium 1 is adhered to the surface of the first conveyor belts 6 by the induced polarization described above. In this state, a rotation of the drive rollers 8R and 8L by the electric motors 11R and 11L causes the generated rotary drive force to be transmitted to the first driven rollers 9R and 9L via the first conveyor belts 6.

With the print medium 1 adhered as described above, the first conveyor belts 6 are moved downstream in the conveyor direction to cause the print medium 1 to be moved to a position under the first inkjet heads 2, so that ink drops are jetted through the nozzles formed in the first inkjet heads 2 for printing. When the printing by the first inkjet heads 2 is finished, the print medium 1 is moved downstream in the conveyor direction to be transferred to the second conveyor belts 7 of the second conveyor unit 5. As described above, since the surfaces of the second conveyor belts 7 are also charged by the belt charging unit 19, the operation of the induced polarization described above causes the print medium 1 to be adhered to the surfaces of the second conveyor belts 7.

In this state, the second conveyor belts 7 are moved downstream in the conveyor direction to cause the print medium 1 to be moved to a position under the second inkjet heads 3, so that ink drops are jetted through the nozzles formed in the second inkjet heads for printing. When the printing by the second inkjet heads is finished, the print medium 1 is further moved downstream in the conveyor direction to be separated from the surface of the second conveyor belts 7 by a separator (not shown) and ejected into a paper ejector.

If the first and second ink jet heads 2 and 3 need to be cleaned, as described above, the first and second cleaning caps 12 and 13 are moved upward to adhere the cap body to the nozzle surface of the first and second ink jet heads 2 and 3. In that state, a negative pressure is created in the cap body to suck ink drops and bubbles through the nozzles of the first and second ink jet heads 2 and 3 so as to clean the first and second ink jet heads 2 and 3. After the cleaning, the first and second cleaning caps 12 and 13 are moved down.

Figure 2:
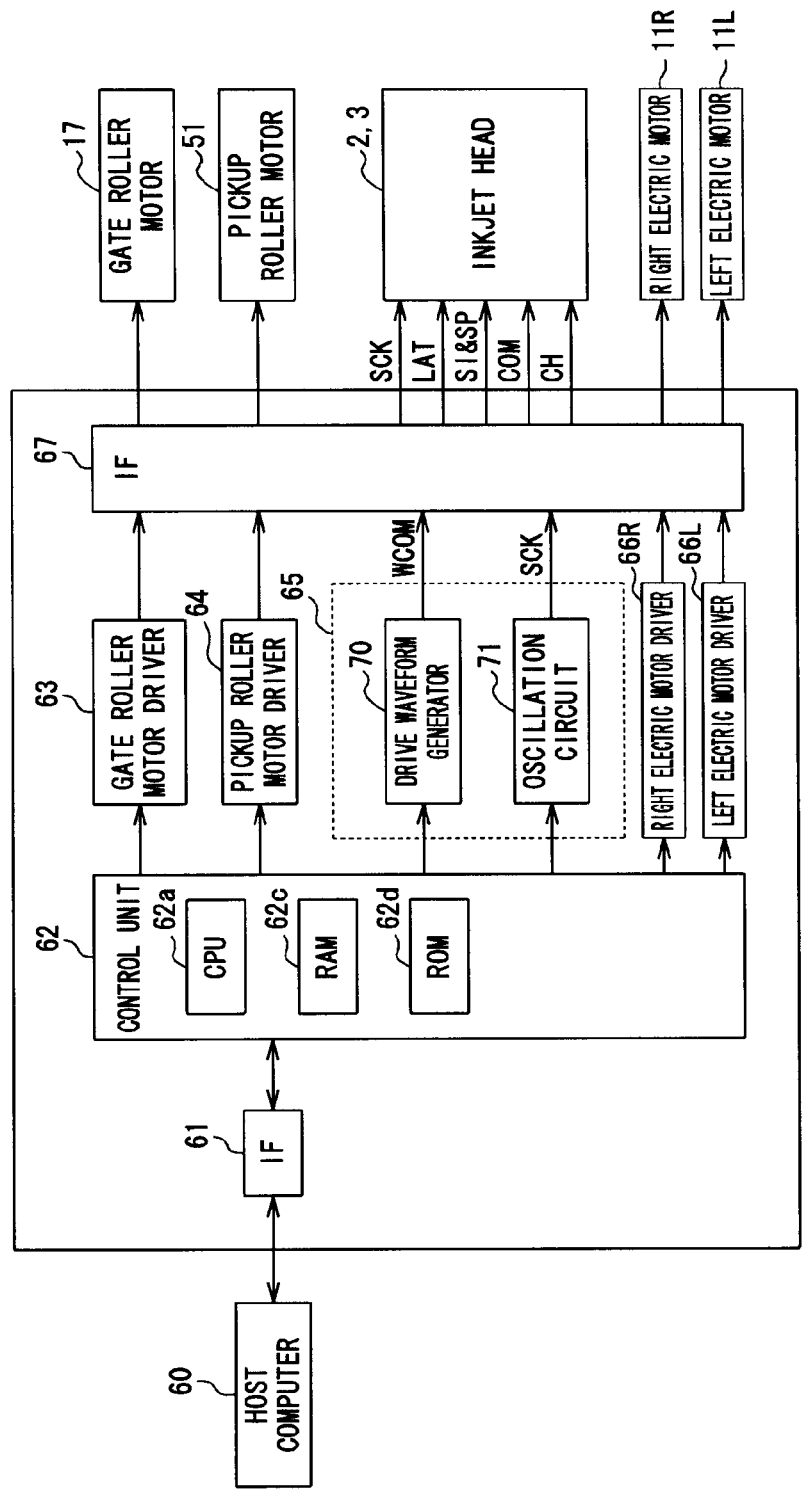
FIG. 2 is a block diagram of the control unit of the inkjet printer of FIGS. 1A and 1B.

The ink jet printer includes a control unit for controlling the printer itself. The control unit processes printing on a print medium by controlling a print unit or a paper feed unit based on print data input from a host computer 60 such as a personal computer or a digital camera, as shown in FIG. 2. The control unit includes: an input interface 61 for receiving print data input from the host computer 60; a control unit 62 comprising a micro computer for executing print processing based on the print data input from the input interface 61; a gate roller motor driver 63 for controlling the drive of the gate roller motor 17; a pickup roller motor driver 64 for controlling the drive of a pickup roller motor 51 for driving the pickup roller 16; a head driver 65 for controlling the drive of the ink jet heads 2 and 3; a right electric motor driver 66R for controlling the drive of the right electric motor 11R; a left electric motor driver 66L for controlling the drive of the left electric motor 11L; and an interface 67 for converting an output signal from each of the drivers 63 to 65, 66R and 66L into a control signal used by the external gate roller motor 17, the pickup roller motor 51, the ink jet heads 2 and 3, the right electric motor 11R and the left electric motor 11L and outputting the control signals.

The control unit 62 includes: a CPU (Central Processing Unit) 62a for executing various processing such as print processing; a RAM (Random Access Memory) 62c for temporarily storing print data input via the input interface 61 or various data to execute processing to print the print data, or for temporarily deploying an application program such as for print processing; and a ROM (Read-Only Memory) 62d comprising a non-volatile semiconductor memory for storing a control program executed by the CPU 62a. When the control unit 62 receives print data (image data) from the host computer 60 via the interface 61, the CPU 62a executes predetermined processing on the print data, outputs print data (drive pulse selection data SI & SP) including which nozzle jets ink drops or how many ink drops are jetted, and outputs a control signal to each of the drivers 63 to 65, 66R and 66L based on the print data and input data from various sensors. When each of the drivers 63 to 65, 66R and 66L outputs the control signal, the interface 67 converts the signal into a drive signal, an actuator corresponding to a plurality of nozzles of an ink jet head, the gate roller motor 17, the pickup roller motor 51, the right electric motor 11R and the left electric motor 11L are actuated to execute paper feed and conveyance of the print medium 1, posture control of the print medium 1, and print processing on the print medium 1. The respective components of the control unit 62 are electrically connected to one another via a bus (not shown).

To write waveform forming data DATA to form a drive signal described later into a waveform memory 701 described later, the control unit 62 also outputs a write enable signal DEN, a write clock signal WCLK, and write address data A0 to A3 and writes the 16-bit waveform forming data DATA into the waveform memory 701. Further, the unit 62 outputs the following to the head driver 65: read address data A0 to A3 to read out the waveform forming data DATA stored in the waveform memory 701, a first clock signal ACLK to set timing to latch the waveform forming data DATA being read out from the waveform memory 701, a second clock signal BCLK to set timing to add the latched waveform data, and a clear signal CLER to clear the latch data.

Figure 3:
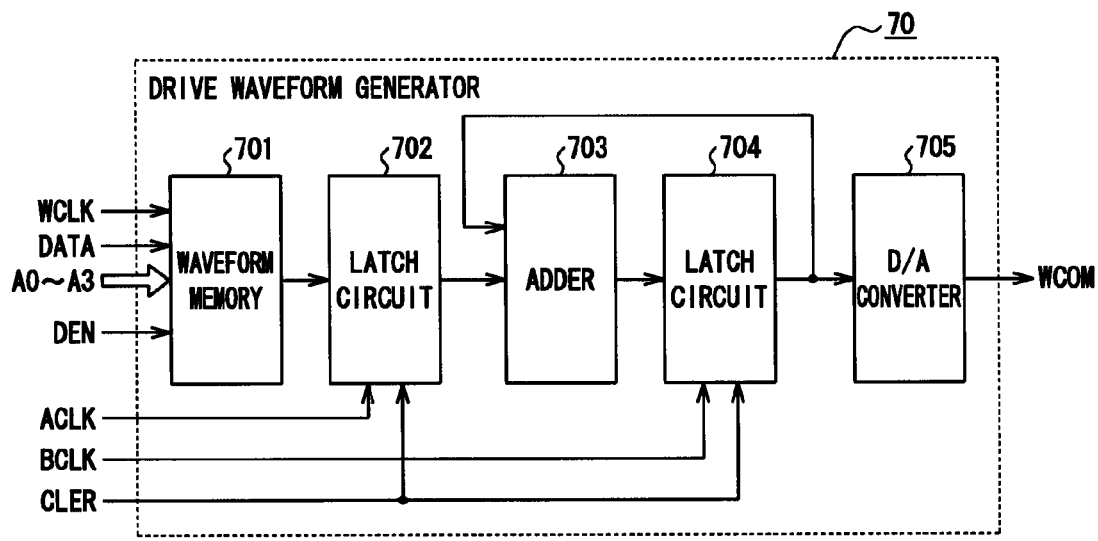
FIG. 3 is a block diagram of the drive waveform generator of FIG. 2.

The head driver 65 includes a drive waveform generator 70 for forming a drive waveform signal WCOM and an oscillation circuit 71 for outputting a clock signal SCK. The drive waveform generator 70 includes: the waveform memory 701 for storing waveform forming data DATA to generate a drive waveform signal input from the control unit 62 in a storage element corresponding to a pre-determined address; a latch circuit 702 for latching the waveform forming data DATA read out from the waveform memory 701 with the first clock signal ACLK described above; an adder 703 for adding output of the latch circuit 702 and the waveform generation data WDATA output from a latch circuit 704 described later; the latch circuit 704 for latching addition output of the adder 703 with the second clock signal BCLK described above; and a D/A converter 705 for converting the waveform generation data WDATA output from the latch circuit 704 into an analog signal, as shown in FIG. 3. A clear signal CLER output from the control unit 62 is input to the latch circuits 702 and 704. When the clear signal CLER is in the off state, latch data is cleared.

Figure 4:
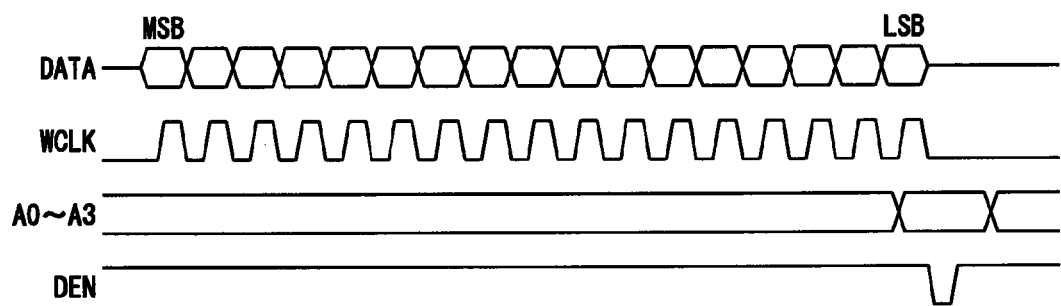
FIG. 4 is a diagram illustrating the waveform memory of FIG. 3.

The waveform memory 701 includes several bit memory elements arranged at each designated address and stores addresses A0 to A3 and the waveform data DATA, as shown in FIG. 4. Specifically, the clock signal WCLK and the waveform data DATA are input to the addresses A0 to A3 designated by the control unit 62, and the input of write enable signal DEN causes the waveform data DATA to be stored in the memory elements.

Next, principles of drive waveform signal generation by the drive waveform generator 70 will be described. First, waveform data, of which the voltage change is 0 during a unit of time, is written at the address A0 described above. Similarly, waveform data $+\Delta V1$ is written at the address A1, waveform data $-\Delta V2$ is written at the address A2, and waveform data $+\Delta V3$ is written at the address A3. The clear signal CLER clears data saved by the latch circuits 702 and 704. The drive waveform signal WCOM rises to the midpoint potential (offset) according to the waveform data.

Figure 5:
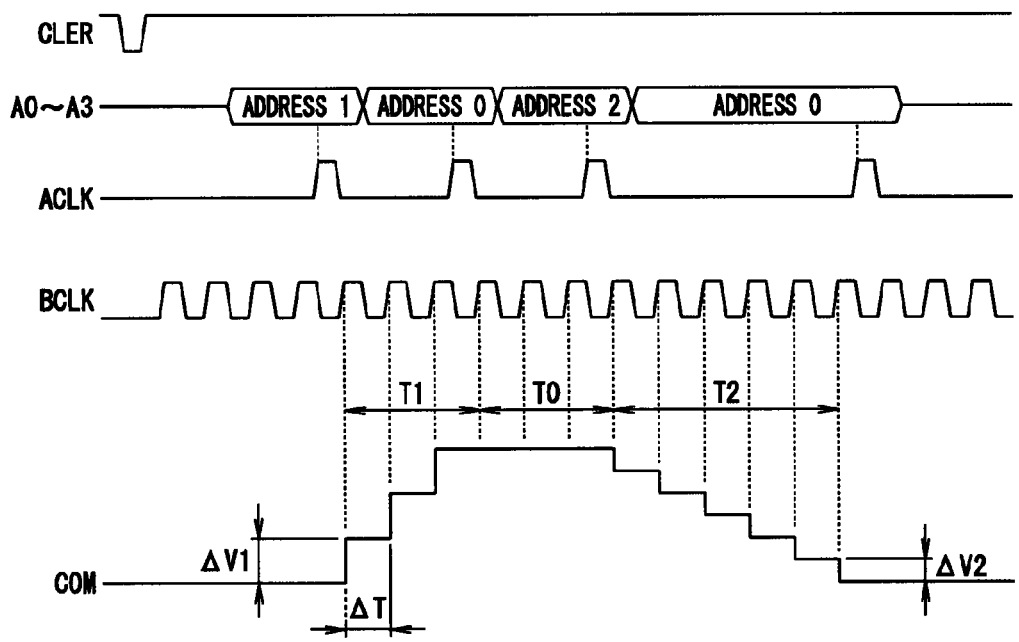
FIG. 5 is a diagram illustrating drive waveform signal generation.

In the above state, when the waveform data at the address A1 is read and the first clock signal ACLK is input, the digital data $+\Delta V1$ is saved in the latch circuit 702, as shown in FIG. 5. The saved digital data $+\Delta V1$ is input to the latch circuit 704 via the adder 703. The latch circuit 704 saves the output of the adder 703 in synchronization with a rise of the second clock signal BCLK. The output of the latch circuit 704 is also input to the adder 703. Accordingly, the output of the latch circuit 704, i.e., the drive signal COM is incremented by $+\Delta V1$ whenever the second clock signal BCLK rises. In this example, the waveform data at the address A1 is read in duration T1. As a result, the signal COM is incremented until the digital data $+\Delta V1$ is tripled in this example.

Then, when the waveform data address A0 is read and the first clock signal ACLK is input, digital data saved in the latch circuit 702 switches to 0. The digital data 0 goes through the adder 703 to be incremented whenever the second clock signal BCLK rises, similarly to the above description. However, since the digital data is 0, the previous value is retained. In this example, the drive signal COM is retained at a certain value in duration T0.

Then, when the waveform data address A2 is read and the first clock signal ACLK is input, digital data saved in the latch circuit 702 switches to $-\Delta V2$. The digital data $-\Delta V2$ goes through the adder 703 to be incremented whenever the second clock signal BCLK rises, similar to the above description. However, since the digital data is $-\Delta V2$, the drive signal COM is actually decremented by $-\Delta V2$ according to the second clock signal. In this example, the signal COM is decremented in duration T2 until the digital data $-\Delta V2$ is sextupled.

Figure 6:
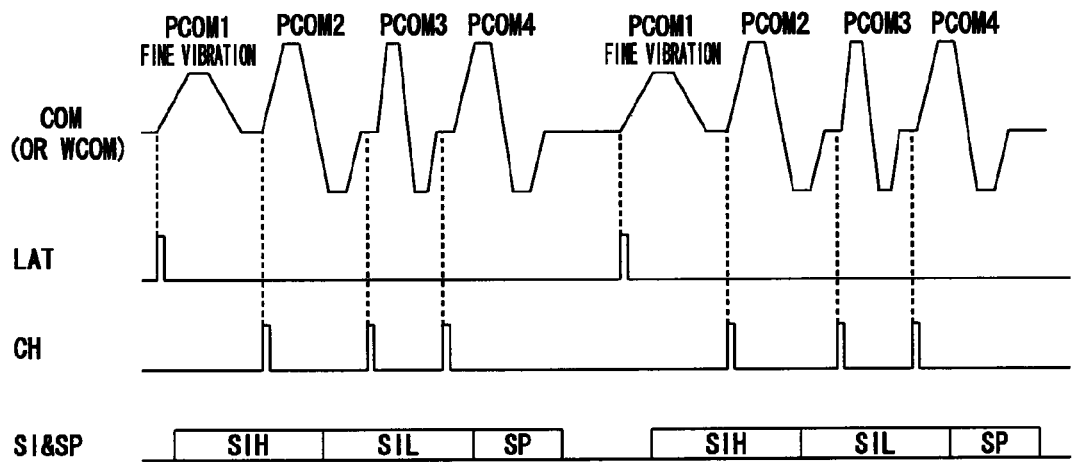
FIG. 6 is a diagram illustrating the drive waveform signals or drive signals connected sequentially in time.

When the D/A converter 705 converts the digital signal generated in the above manner into an analog signal, a drive waveform signal WCOM as shown in FIG. 6 is obtained. A drive signal output circuit shown in FIG. 7 amplifies the power of the analog signal and supplies the signal as a drive signal COM to the ink jet heads 2 and 3. In this way, actuators such as piezoelectric elements provided for the respective nozzles can be driven, so that the nozzles can jet ink drops. The drive signal output circuit includes: a modulator 24 for modulating a pulse of a drive waveform signal WCOM generated by the drive waveform generator 70; a digital power amplifier 25 for amplifying power of the modulated (PWM) signal subjected to the pulse modulation by the modulator 24; and a low pass filter 26 for smoothing the modulated (PWM) signal subjected to the power amplification by the digital power amplifier 25; and an inverse filter 23 interposed between the drive signal generator 70 and the modulator 24.

The rise time of the drive signal COM allows an increase in the volume of a cavity (pressure chamber) communicating with a nozzle and to pull in ink (pull in meniscus, from the viewpoint of the ink jetted surface). The fall time of the drive signal COM allows a decrease in the volume of the cavity and to push out ink (push out meniscus, from the viewpoint of the ink-jetted surface). As a result of the pushing-out of ink, the nozzle jets ink drops. A waveform of the drive signal COM or the drive waveform signal WCOM can be modified with waveform data 0, $+\Delta V1$, $-\Delta V2$, $+\Delta V3$, the first clock signal ACLK and the second clock signal BCLK written at the addresses A0 to A3, as easily inferred from the above description.

The voltage increase and decrease rate and the peak value of the drive signal COM, in a voltage trapezoid wave, are variously changed so that the amount of pulled in ink, the pull-in speed, the amount of pushed out ink and the push-out speed can be changed. This can change the amount of ejected ink to produce different sizes of ink dots. Thus, even if a plurality of drive signals COM are coupled time-sequentially as shown in FIG. 6, a single drive signal COM is selected from the signals to be supplied to a piezoelectric actuator 22 for jetting of ink drops; or a plurality of drive signals COM are selected to be supplied to the piezoelectric actuator 22 for jetting of multiple ink drops, thereby producing various sizes of ink dots. That is, if a plurality of ink drops are jetted at the same position while the ink is wet, a large ink drop is jetted, so that the size of an ink dot can be large. The combination of such techniques can accomplish multiple tones. The drive pulse at the far left in FIG. 6 only pulls in ink but does not push out ink. This is called fine vibration, which is used to inhibit or prevent a nozzle from drying out without jetting ink drops.

As a result, the following are input to the ink jet heads 2 and 3: the drive signal COM generated by the drive signal output circuit; drive pulse selection data SI & SP to select a nozzle for jetting based on print data and to decide the time of connection between the drive signal COM and an actuator, such as a piezoelectric element; a latch signal LAT and a channel signal CH to connect the drive signal COM and the actuators of the ink jet heads 2 and 3 based on the drive pulse selection data SI & SP after nozzle selection data is input to all nozzles; and a clock signal SCK to transmit the drive pulse selection data SI & SP as a serial signal to the ink jet heads 2 and 3.

Figure 8:
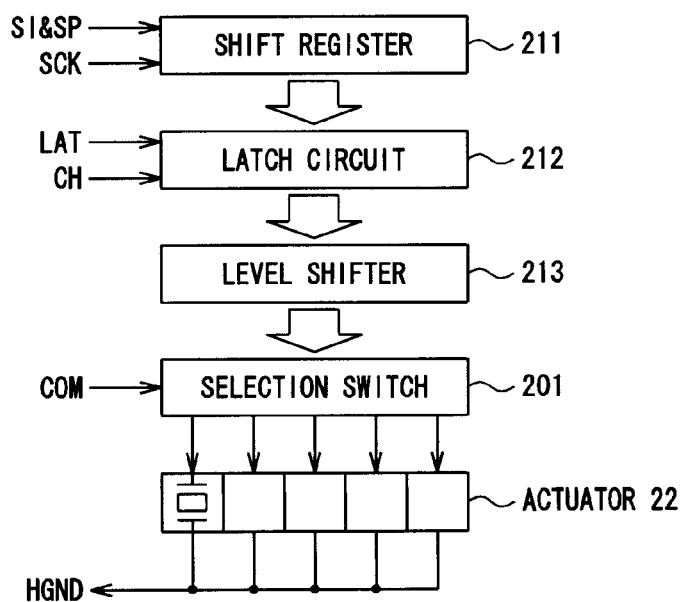
FIG. 8 is a block diagram of a selector for connecting a drive signal to an actuator.

Next, a mechanism to connect the drive signal COM output from the drive signal output circuit to the actuator, such as a piezoelectric element, will be described. FIG. 8 is a block diagram of a selector for connecting the drive signal COM to the actuator, such as a piezoelectric element. The selector includes: a shift register 211 for saving the drive pulse selection data SI & SP to designate an actuator, such as a piezoelectric element, corresponding to a nozzle for jetting ink drops; a latch circuit 212 for temporarily saving data of the shift register 211; a level shifter 213 for converting the output level of the latch circuit 212; and a selection switch 201 for connecting a drive signal COM to an actuator, such as a piezoelectric element, depending on the output of the level shifter.

As drive pulse selection data SI & SP are serially input to the shift register 211, a storage area of the register serially shifts from the first part to latter parts depending on an input pulse of a clock signal SCK. After drive pulse selection data SI & SP for the number of nozzles is stored in the shift register 211, the latch circuit 212 latches each output signal of the shift register 211 according to an input latch signal LAT. The level of a signal saved in the latch circuit 212 is converted into a voltage level to turn on/off the selection switch 201 in the next part by the level shifter 213. This is because the voltage of the drive signal COM is higher than the output voltage of the latch circuit 212, and the range of the operating voltage of the selection switch 201 is, accordingly, also set to a high range. Thus, the actuator, such as a piezoelectric element, of which selection switch 201 is closed by the level shifter 213, is connected to the drive signal COM at a time for connection of the drive pulse selection data SI & SP. After drive pulse selection data SI & SP of the shift register 211 is saved in the latch circuit 212, the next print information is input to the shift register 211, and data saved in the latch circuit 212 is serially updated each time ink drops are jetted. Reference character HGND in the figure denotes a ground terminal of the actuator, such as a piezoelectric element. The selection switch 201 also maintains input voltage of the actuator 22 at voltage immediately before separation even after the actuator, such as a piezoelectric element, is separated from a drive signal COM.

Figure 9:
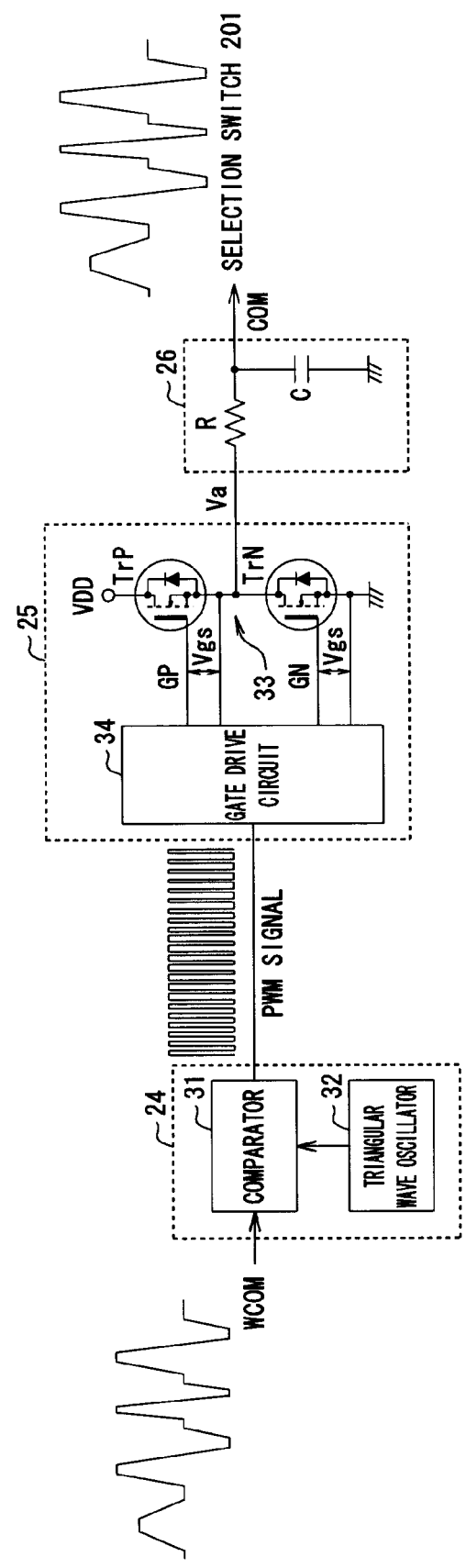
FIG. 9 is a block diagram showing details of a modulator, a digital power amplifier and a low pass filter of the drive signal output circuit of FIG. 7.
Figure 10:
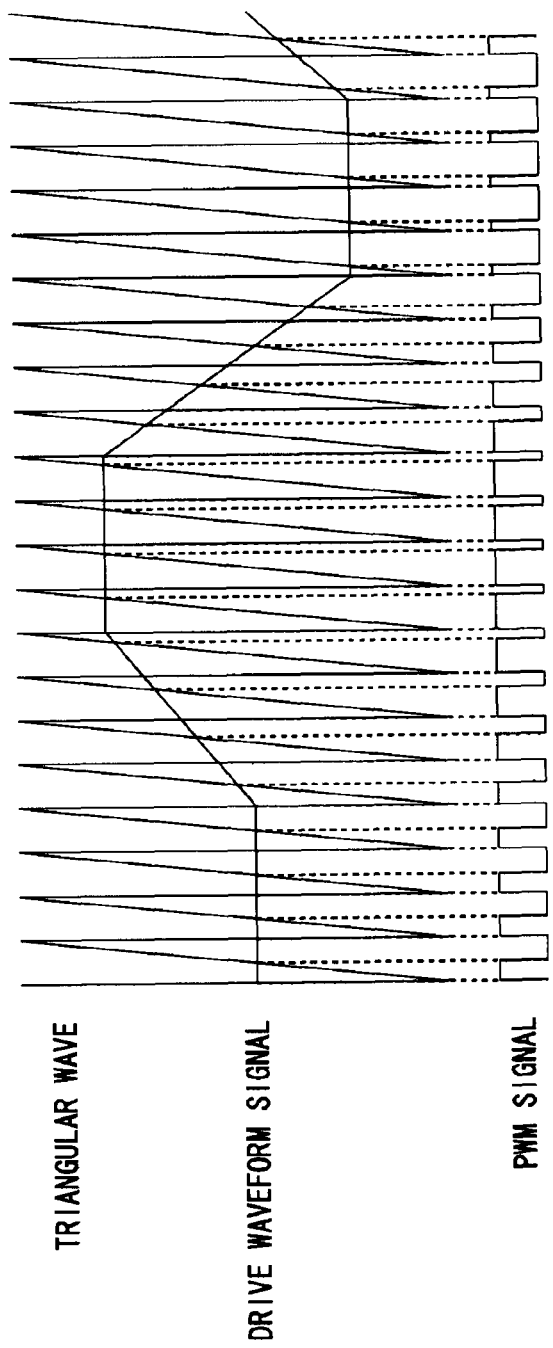
FIG. 10 is a diagram illustrating an operation of the modulator of FIG. 9.

FIG. 9 shows the specific configuration between the modulator 24 of the drive signal output circuit and the low pass filter 26 described above. A general pulse width modulator (PWM) is used as the modulator 24 for modulating a pulse of a drive waveform signal WCOM. The modulator 24 includes a known triangular wave oscillator 32, and a comparator 31 for comparing a triangular wave output from the triangular wave oscillator 32 and the drive waveform signal WCOM. The modulator 24 outputs a modulated (PWM) signal Hi if the level of the drive waveform signal WCOM is greater than or equal to the level of the triangular wave, and outputs a modulated (PWM) signal Lo if the level of the drive waveform signal WCOM is below the level of the triangular wave, as shown in FIG. 10. This embodiment employs a pulse width modulator as a modulator; in other embodiments, a pulse density modulator (PDM) can be employed.

Figure 11:
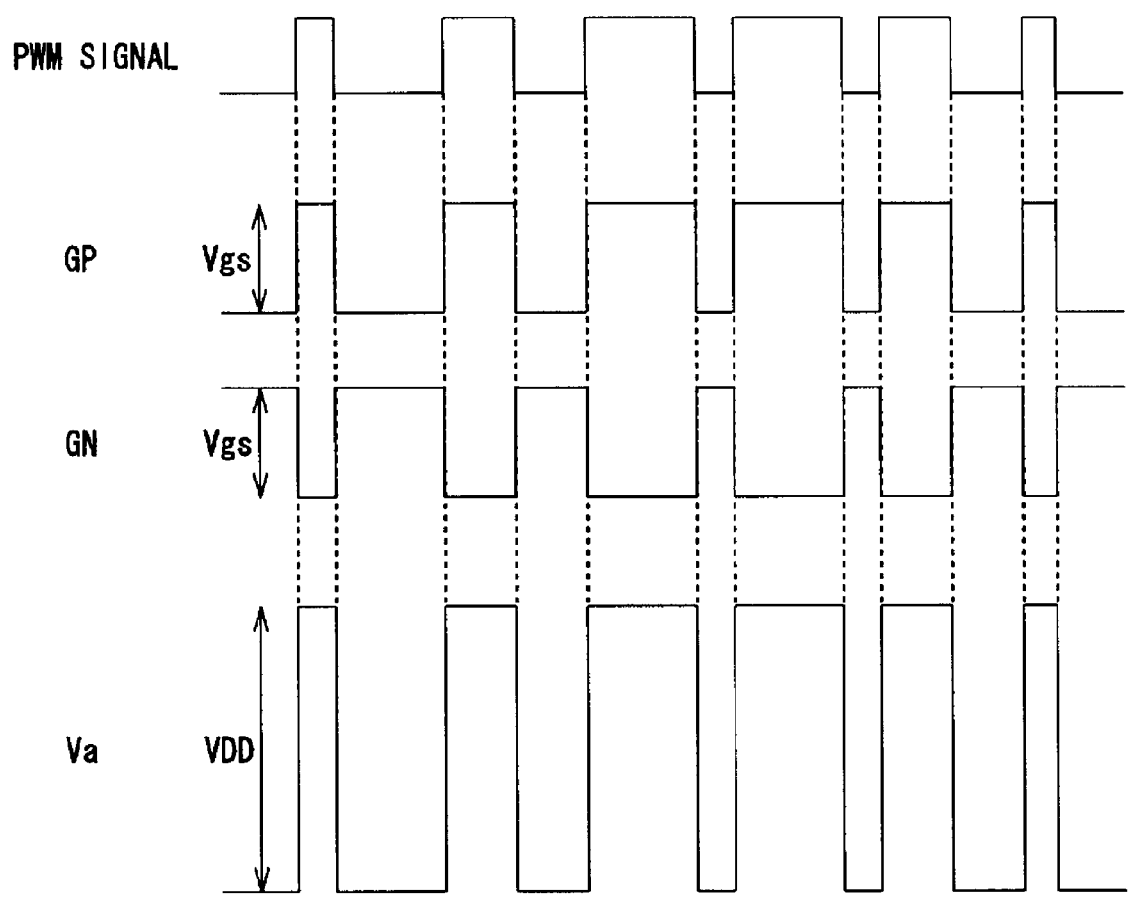
FIG. 11 is a diagram illustrating an operation of the digital power amplifier of FIG. 9.

The digital power amplifier 25 includes a half bridge driver stage 33 including both a MOSFETTrP and a MOSFETTrN to actually amplify power, and a gate drive circuit 34 for modifying the gate-source signals GP and GN of the MOSFETTrP and TrN based on a modulated (PWM) signal from the modulator 24. The half bridge driver stage 33 is a push-pull combination of the high-side MOSFETTrP and the low-side MOSFETTrN. A gate-source signal of the high-side MOSFETTrP is labeled as GP, a gate-source signal of the low-side MOSFETTrN is labeled as GN, and an output of the half bridge driver stage 33 is labeled as Va. FIG. 11 shows how GP, GN and Va change depending on a modulated (PWM) signal. A voltage value Vgs of the gate-source signals GP and GN of the respective MOSFETTrP and TrN is the voltage value required to turn ON the MOSFETTrP and TrN.

When a modulated (PWM) signal is at a Hi level, the gate-source signal GP of the high-side MOSFETTrP is at a Hi level and the gate-source signal GN of the low-side MOSFETTrN is at a Lo level. Thus, the high-side MOSFETTrP is in the ON state and the low-side MOSFETTrN is in the OFF state. As a result, the output Va of the half bridge driver stage 33 becomes supply power VDD. Meanwhile, when a modulated (PWM) signal is at the Lo level, the gate-source signal GP of the high-side MOSFETTrP is at a Lo level, and the gate-source signal GN of the low-side MOSFETTrN is at a Hi level. Thus, the high-side MOSFETTrP is in the OFF state and the low-side MOSFETTrN is in the ON state. As a result, the output Va of the half bridge driver stage 33 is 0.

The output Va from the half bridge driver stage 33 of the digital power amplifier 25 is supplied as a drive signal COM to the selection switch 201 via the low pass filter 26. The low pass filter 26 includes a combination of two coils L1 and L2 and two capacitors C1 and C2. The low pass filter 26 is designed to sufficiently attenuate a high-frequency component, i.e., a amplified digital signal (PWM) component of the output Va from the half bridge driver stage 33 of the digital power amplifier 25 and not to attenuate a drive signal component COM (or drive waveform component WCOM).

As described above, when the MOSFETTrP and TrN of the digital power amplifier 25 are digitally driven, the MOSFETs operate as switch elements so that current flows into the MOSFETs in the ON state. However, a drain-source resistance value is very small; hence the power loss is small. On the other hand, no current flows into the MOSFETs in the OFF state so that the power loss is eliminated. Thus, the power loss of the digital power amplifier 25 is small enough so that small MOSFETs can be used, dispensing with a cooling unit such as a cooling plate radiator. The efficiency is about 30% to linearly drive a transistor, while the efficiency of a digital power amplifier is 90% or more. A cooling plate radiator of a transistor can be 60-mm square for a single transistor. Dispensing with such a cooling plate radiator is distinctly advantageous in actual layout.

Figure 12A:
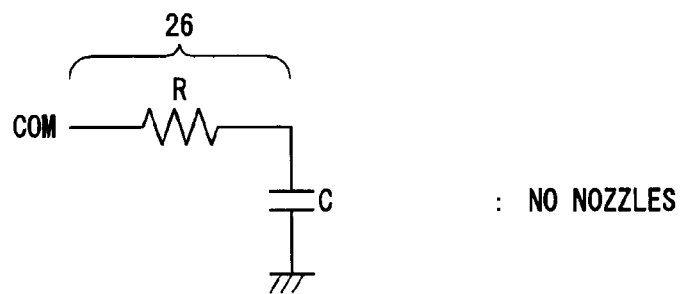
FIG. 12A is the diagram illustrating a low-pass filter configured without connected actuators.

Next, the inverse filter 23 provided in the drive signal output circuit of FIG. 7 will be described. As described above, the low pass filter is designed to sufficiently attenuate a carrier signal component of a power-amplified modulated (PWM) signal, and to not attenuate a drive signal component COM (or drive waveform component WCOM), but due to the capacitance Cn of the actuator 22, a change in the number of the actuators to be driven causes a change in a low-pass filter cutoff frequency which is comprised of capacitances of the low pass filter and the actuators. The transfer function $G_0(s)$ of the low pass filter 23 comprised of the primary low-pass filter shown in FIG. 12A is expressed by the following equation (1):

[Equation 1]

$$G_0(s) = \frac{1}{1+sRC} \qquad (1)$$

Figure 12B:
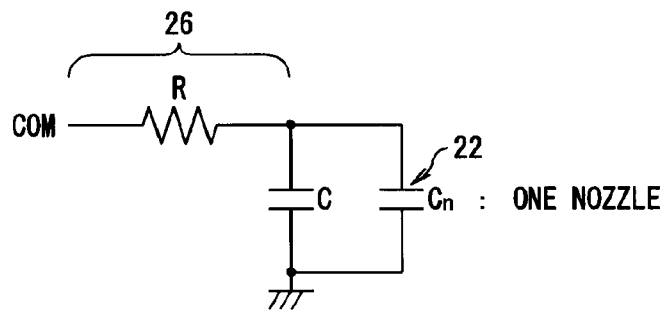
FIG. 12B is the diagram illustrating a low-pass filter configured with one connected actuator.
Figure 12C:
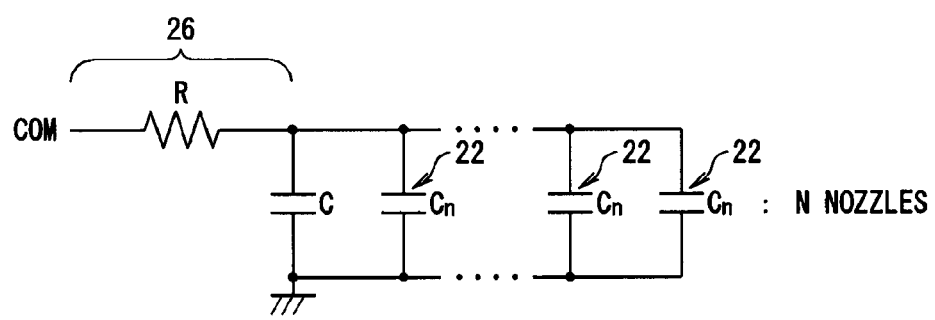
FIG. 12C is the diagram illustrating a low-pass filter configured with N connected actuators.

Every time another actuator 22, such as a piezoelectric element, is added to be connected to the low pass filter 23, as shown in FIGS. 12B and 12C, another capacitance Cn is sequentially connected in parallel; therefore, the low-pass filter cutoff frequency which is comprised of capacitances of the low pass filter and the actuators is changed. For example, a transfer function $G_t(s)$ of the whole drive circuit is expressed by the following equation (2) where N is the number of the actuators 22 such as piezoelectric elements where the selection switch 201 is closed:

[Equation 2]

$$Gt(s) = \frac{1}{1 + sR(C + N + Cn)} \quad (2)$$

Even in a case where the number N of the connected actuators 22 is 1, that is, the low-pass filter cutoff frequency comprised of capacitances of the low pass filter and the actuators is the maximum, a carrier signal component of a power-amplified modulated (PWM) signal can be sufficiently attenuated, while even in a case where the number N of the connected actuators 22 is the maximum, that is, the low-pass filter cutoff frequency comprised of capacitances of the low pass filter and the actuators is the minimum, if the attenuation of a drive signal component COM (or drive waveform component WCOM) is prevented, any change in the number of the connected actuators 22 does not cause distortion to a drive signal COM. The latter case requires an extremely high PWM carrier frequency or steep attenuation characteristics with a higher order low pass filter, but a higher PWM carrier frequency increases the heat generation of the digital power amplifier, and a higher order low pass filter makes the low pass filter complicated, resulting in an enlargement of the head drive.

Figure 7:
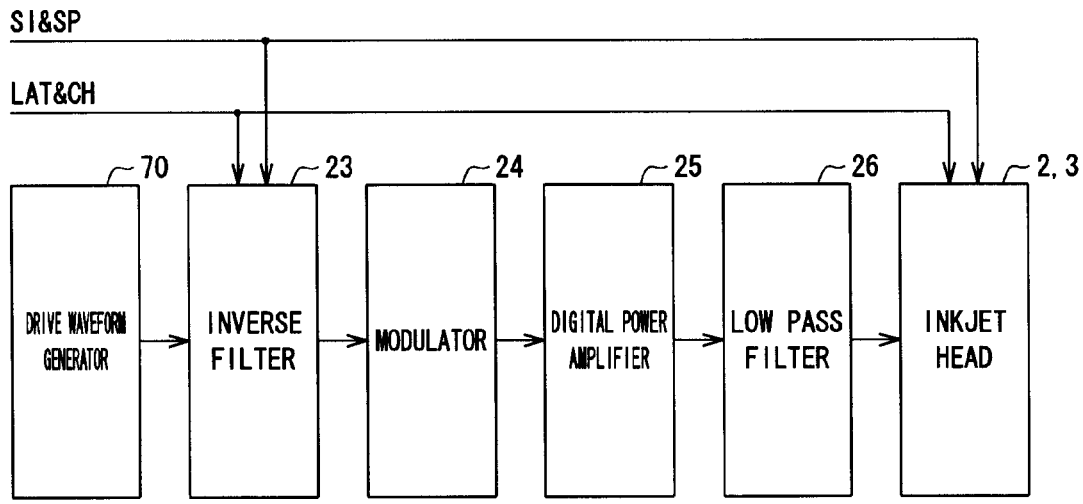
FIG. 7 is a block diagram of a drive signal output circuit.
Figure 13:
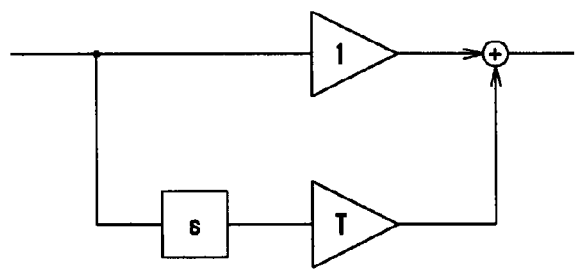
FIG. 13 is a block diagram of the inverse filter of FIG. 7.

Then, in the present embodiment, as shown in above described FIG. 7, the inverse filter 23 is interposed at a subsequent stage of the drive waveform generator 70, for emphasizing the component which is attenuated by the low-pass filter and is comprised of capacitances of the low pass filter and the actuators. That is, in the drive waveform signal WCOM which already passed the inverse filter 23, the component attenuated by capacitance of the low pass filter and the actuators is emphasized, and even if the signal component is attenuated by the capacitance of the low pass filter and the actuators, the actuators 22, such as each piezoelectric element, is applied with the original drive signal COM or drive pulses PCOM. A transfer function $G_{IF}(s)$ of the inverse filter 23 is expressed by the following equation (3), and the block diagram is shown as FIG. 13, where T corresponds to a time constant:

$$G_{IF}(s) = 1 + sT/1 + sR(C + N \times Cn) \quad (3) \qquad \text{[Equation 3]}$$

Figure 14:
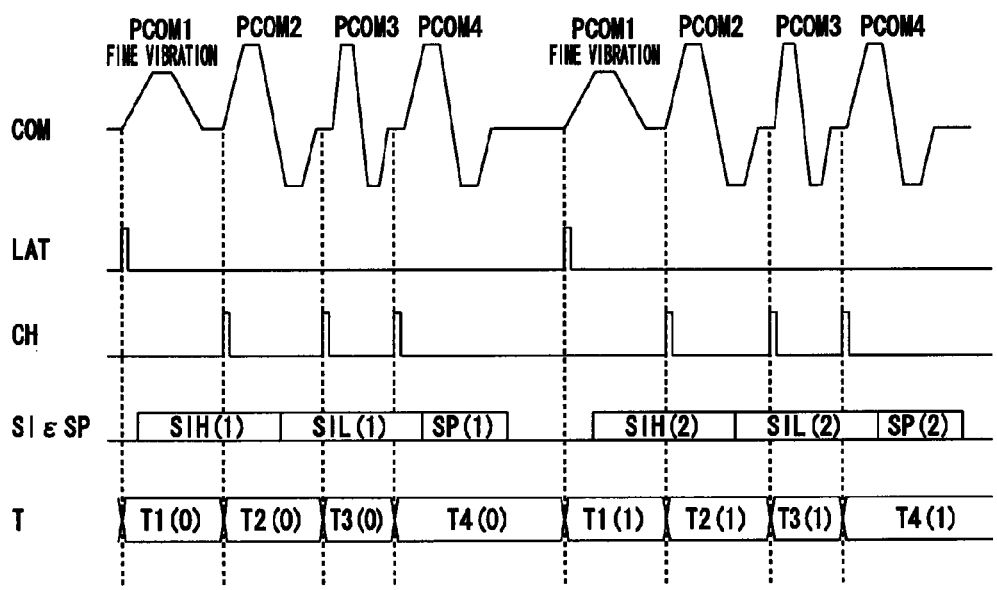
FIG. 14 is a conceptual diagram in which the number of actuators of nozzles that jets ink drops from print data is calculated so as to set a time constant of an inverse filter as a function of the number of the actuators.

Specifically, the inverse filter 23 is configured with a digital filter. Because the capacitance Cn of each actuator 22, such as a piezoelectric element, is known in advance, once the number of the actuators 22, such as piezoelectric elements, which are connected to the drive signal COM is found, the time constant T of the equation (3) or FIG. 13 will be obtained. With the obtained time constant T, the frequency characteristics which are opposite to that of the drive circuit can be obtained only by changing the time constant component of the digital filter. FIG. 14 is a conceptual diagram in which the number of actuators of nozzles for jetting ink drops is calculated based on drive pulse selection data SI & SP, so as to set a time constant of an inverse filter 23 as a function of the number of the actuators. The drive signal selection data SI & SP is actually read in one cycle earlier to select the drive pulses PCOM of the drive signal COM (drive signal COM of first drive pulse PCOM 1 to fourth drive pulse PCOM 4). When the drive signal selection data SI(1) & SP(1) of the next cycle is read in, time constants T1(1) to T4(1) are written into a memory, so that, just before the first to fourth drive pulses PCOM 1 to PCOM 4 of the next cycle are output, the time constants T1(1) to T4(1) are output to the inverse filter 23 formed of a digital filter. As a result, the inverse filter 23 is ensured to have appropriate frequency characteristics without causing delay, and the actuator 22, such as a piezoelectric element, of each nozzle is applied with the original drive signal COM or drive pulses PCOM.

As described above, according to a head drive apparatus of an inkjet printer of the present embodiment, the drive waveform generator 70 generates a drive waveform signal WCOM which is used to control the drive of an actuator, such as a piezoelectric element, the generated drive waveform signal WCOM is modulated by the modulator 24 such as a pulse width modulator, the modulated signal is power-amplified by the digital power amplifier 25, and the amplified digital signal is smoothed by the low pass filter 26 to be supplied to the actuator as a drive signal. The low pass filter 26 has filter characteristics which cause only the amplified digital signal component to be sufficiently smoothed, and a rapid rise and fall of a drive signal to an actuator is enabled, and, at the same time, the digital power amplifier 25 efficiently amplifies the drive signal, which eliminates a cooling unit such as a cooling plate radiator.

Since the inverse filter 23 has frequency characteristics which are at least comprised of capacitances of the low pass filter 26 and the actuator 22 and are opposite to that of the low-pass filter and the inverse filter is provided on a subsequent stage of the drive waveform generator 70, the component among the drive waveform signals WCOM component which is comprised of capacitances of the low pass filter 26 and the actuator 22 and is attenuated by the low-pass filter can be emphasized, which inhibits or prevents distortion of the drive signal COM which is actually applied to the actuator 22.

The inverse filter 23 has frequency characteristics which are set as a function of the number of the actuators 22 of nozzles through which ink drops are jetted, so that a different low-pass filter attenuated component can be accurately emphasized as a function of the number of the connected actuators, which further inhibits or prevents distortion of the drive signal COM actually applied to the actuator 22.

Figure 15:
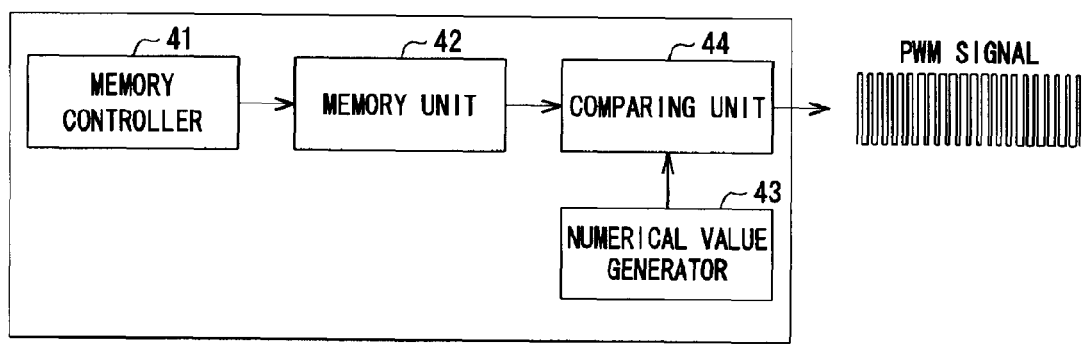
FIG. 15 shows another embodiment of a head drive of an inkjet printer according to the present invention, and is a block diagram of a drive waveform generator and a modulator thereof.

FIG. 15 shows another embodiment a drive waveform generator and a modulation section included in a head drive of an inkjet printer according to the present invention. The drive waveform generator 70 of FIG. 3 converts a digitally composed drive waveform signal into an analog signal by the D/A converter 705 and outputs the analog signal. Conversely, in FIG. 15, the memory controller 41 reads out digital waveform data from the memory unit 42, so that the read out digital waveform data is compared with the number value of the numerical value generator 43 which corresponds to a triangular wave in the comparing unit 44 to determine which of Hi or Lo of the modulated (PWM) signal is to be output as a modulated (PWM) signal. In this case, all the processes are digitally controlled up to the output of the modulated (PWM) signal, which allows the memory control unit 41, the memory unit 42, the numerical value generator 43, and the comparing unit 44 to be cooperated in a CPU or a gate array. In this case, the memory controller 41 and the memory unit 42 are connected to the drive waveform generator of the present invention, and the numerical value generator 43 and the comparing unit 44 form a modulation section.

Figure 16:
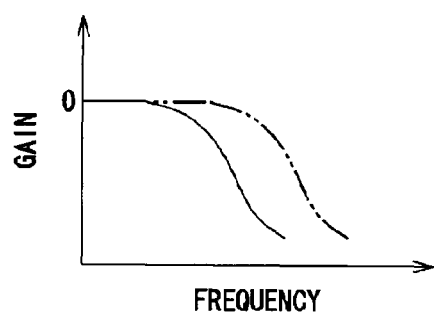
FIG. 16 is a diagram illustrating a case where the gain of an output circuit decreases as a function of the number of connected actuators.
Figure 17:
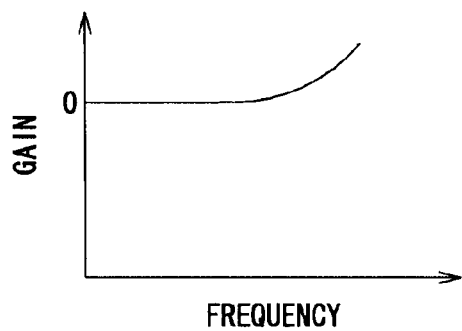
FIG. 17 is a diagram illustrating frequency characteristics of an inverse filter in the case of FIG. 16.
Figure 18:
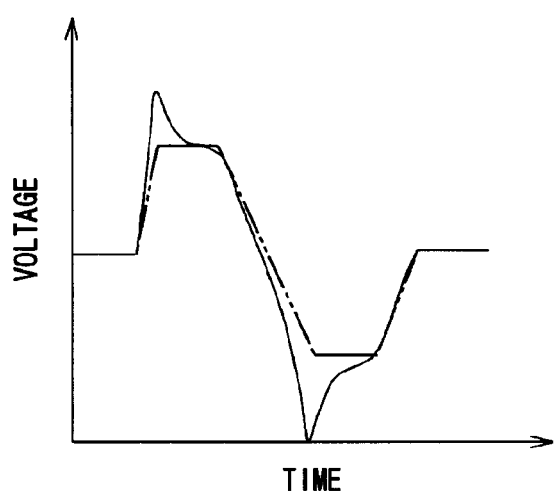
FIG. 18 is a diagram illustrating drive pulses which are output from the inverse filter of FIG. 17.

Next, a second embodiment of a head drive of an inkjet printer according to the present invention will be described. As described in the first embodiment, as the number of nozzles through which ink drops are jetted is increased, capacitance is added according to the number of increased actuators 22. Therefore, the frequency characteristics of an output circuit having the low pass filter 26 is characterized by a gain which decreases as shown by the solid line with respect to the target values shown by the chain double-dashed line of FIG. 16. In this case, the high-pass inverse filter 23 as shown in FIG. 17 is required to offset the distortion. However, the drive pulses supplied to the output circuit through the high-pass inverse filter 23 creates an overshoot waveform as shown by the solid line with respect to the target values shown by the chain double-dashed line of FIG. 18, which requires a power source having a wide dynamic range.

Figure 19:
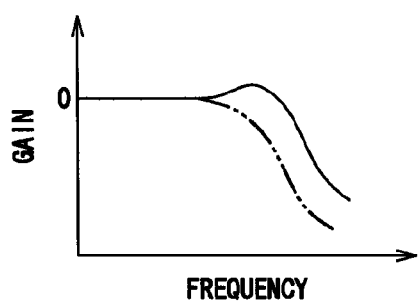
FIG. 19 is a diagram illustrating a case where the gain of an output circuit increases as a function of the number of connected actuators.
Figure 20:
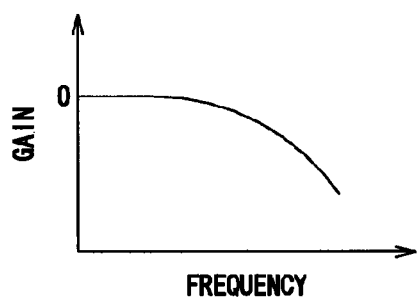
FIG. 20 is a diagram illustrating frequency characteristics of an inverse filter in the case of FIG. 19.
Figure 21:
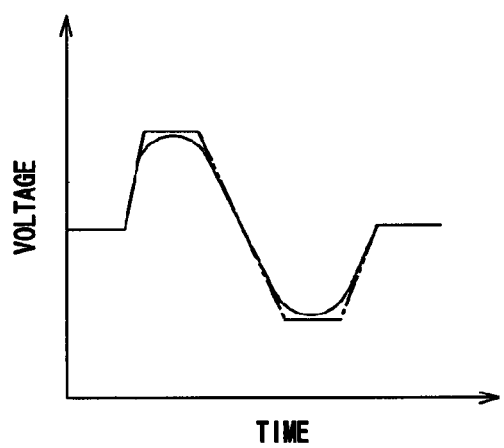
FIG. 21 is a diagram illustrating drive pulses which are output from the inverse filter of FIG. 20.

Then, assuming a case where one half of the actuators of the total nozzles are driven, and after the low pass filter 26 is set so that the gain of the output circuit in the above state matches with a target value, when the number of the nozzles through which ink drops are jetted is decreased below the number of the actuators in the assumption, the output circuit has the frequency characteristics in which the gain is increased as shown in the solid line with respect to the target value shown by the chain double-dashed line of FIG. 19. In such a case, the low-pass inverse filter 23 shown in FIG. 20 is required to offset the distortion. The drive pulses which are supplied to the output circuit via the low-pass inverse filter 23 draws a somewhat undershoot waveform as shown by the solid line with respect to the target values shown by the chain double-dashed line of FIG. 21, which allows a power source having a narrow dynamic range to be used.

Figure 22:
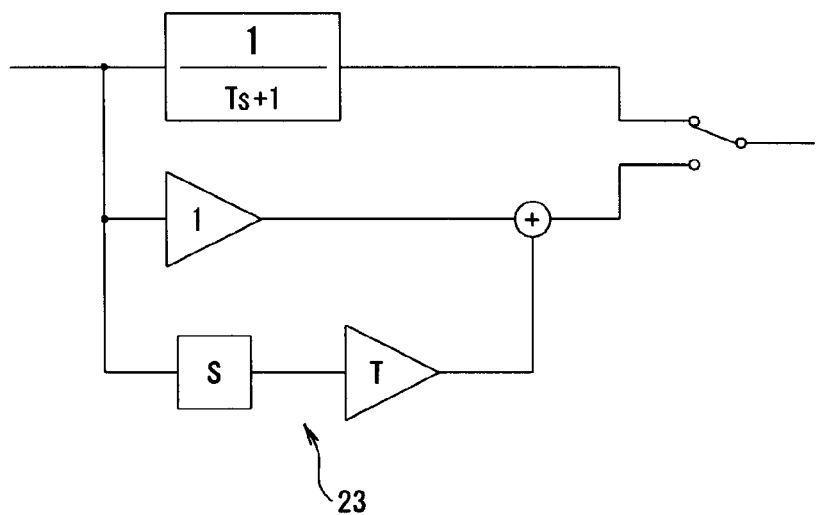
FIG. 22 is a block diagram of an inverse filter showing a second embodiment of a head drive of an inkjet printer according to the present invention.

Therefore, in the present embodiment, as shown in FIG. 22, in a case where the above described high frequency emphasis filter and the primary low-pass or high frequency attenuation filter are arranged in parallel to form the inverse filter 23, when the gain of the output circuit is decreased, that is, when the number of actuators of the nozzles through which ink drops are jetted exceeds a predetermined value, the high frequency emphasis filter is selected by a switch, and when the gain of the output circuit is increased, that is, when the number of actuators of the nozzles through which ink drops are jetted is less than a predetermined value, the low-pass or high frequency attenuation filter is selected by a switch, respectively, so as to output drive pulses.

The above configuration enables a component, among the drive waveform signal components, which is changed by the filter comprised of capacitances of the low pass filter and the actuator to be appropriately emphasized or attenuated, which inhibits or prevents distortion of the drive signal COM actually applied to the actuator. In addition, when the frequency characteristics of the inverse filter is set as a function of the number of the actuators of the nozzles through which ink drops are jetted, a different low-pass filter attenuated component can be accurately emphasized as a function of the number of the connected actuators, which further inhibits or prevents distortion of the drive signal actually applied to the actuator.

A method for setting a time constant T of the high frequency emphasis filter (primary high-pass filter) of the inverse filter will be explained below. The transfer functions G(s) and G(jω), and a gain of the primary high-pass filter can be expressed by the following equations:

$$G(s) = 1 + sT, \quad G(j\omega) = 1 + j\omega T$$

$$\text{Gain} = 20 \log_{10} \sqrt{1 + (\omega T)^2} \quad \text{[Equation 4]}$$

Figure 23:
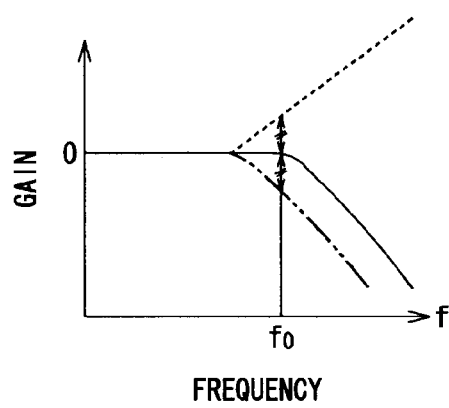
FIG. 23 is a diagram illustrating gain control by a primary high-pass filter in the inverse filter of FIG. 22.

In this case, since the number of actuators of the nozzles through which ink drops are jetted exceeds a predetermined value, and the frequency characteristics shown by the solid line is decreased as shown by the chain double-dashed line of FIG. 23, the time constant T can be obtained by setting the gain of the primary high-pass filter so that the gain at a predetermined frequency $f_0$ will be a predetermined value, i.e., 0 in this case, and solving the equations. The predetermined frequency $f_0$ is set equal to a target frequency (because the filter comprised of capacitances of the low pass filter and the actuator is basically a low-pass filter), where a drive waveform signal has no, or almost no, power spectrum within a range higher than the target frequency. The time constant T can be solved as follows, where the gain at a predetermined frequency $f_0$ of the filter comprised of the low pass filter and the actuator is $G_0$, and $\omega_0 = 2\pi f_0$:

[Equation 5]

$$20 \log_{10} \sqrt{1 + (\omega T)^2} + 20 \log_{10} |G_0| = 0$$

$$1 + (\omega_0 T)^2 = \frac{1}{G_0^2}$$

$$\therefore T = \pm \frac{\sqrt{1 - G_0^2}}{\omega_0 G_0}$$

A method for setting a time constant T of the low-pass or high frequency attenuation filter (primary low-pass filter) of the inverse filter will be explained. The transfer functions G(s) and G(jω), and a gain Gain of the primary low-pass filter can be expressed by the following equations:

[Equation 6]

$$G(s) = \frac{1}{1 + sT}, \quad G(j\omega) = \frac{1}{1 + j\omega T}$$

$$\text{Gain} = 20 \log_{10} \sqrt{\frac{1}{1 + (\omega T)^2}}$$

Figure 24:
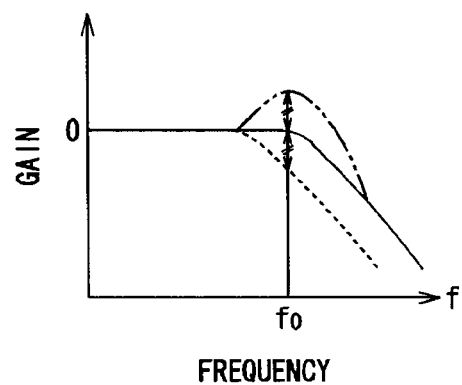
FIG. 24 is a diagram illustrating gain control by a primary low-pass filter in the inverse filter of FIG. 22.

In this case, since the number of the actuators of the nozzles through which ink drops are jetted is less than a predetermined value, and the frequency characteristics of a gain shown by the solid line is increased as shown by the chain double-dashed line of FIG. 24, the time constant T can be obtained by setting the gain of the primary low-pass filter so that the gain at a predetermined frequency $f_0$ will be a predetermined value, i.e., 0 in this case, and solving the equations. The time constant T can be solved as follows, where the gain at a predetermined frequency $f_0$ of the filter comprised of the low pass filter and the actuator is $G_0$, and $\omega_0 = 2\pi f_0$:

[Equation 7]

$$20 \log_{10} \sqrt{\frac{1}{1 + (\omega_0 T)^2}} + 20 \log_{10} |G_0| = 0$$

$$1 + (\omega_0 T)^2 = G_0^2$$

$$\therefore T = \pm \frac{\sqrt{G_0^2 - 1}}{\omega_0}$$

Figure 25:
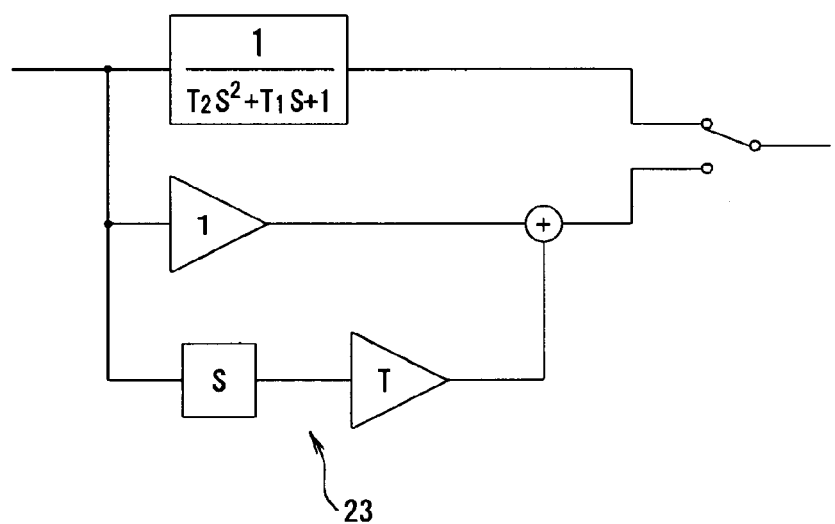
FIG. 25 is a block diagram of an inverse filter showing another embodiment of a head drive of an inkjet printer according to the present invention.

The low-pass or high frequency attenuation filter may be one such as the secondary low-pass filter shown in FIG. 25.

Figure 26:
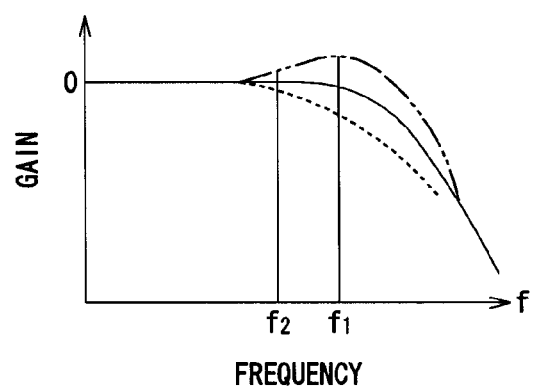
FIG. 26 is a diagram illustrating gain control by a secondary low-pass filter in the inverse filter of FIG. 25.

The use of the secondary low-pass filter enables, as shown in FIG. 26, the adjustment of a gain of two predetermined frequencies $f_1$ and $f_2$. For example, when one predetermined frequency $f_1$ is set equal to a target frequency as in the case of the predetermined frequency $f_0$ of the above described primary low-pass filter, the other predetermined frequency $f_2$ can be set equal to another target frequency or a frequency where the gain thereof is changed when the gain of the one predetermined frequency $f_1$ is adjusted. The transfer functions G(s) and G(jω), and a gain of the secondary low-pass filter can be expressed by the following equations:

[Equation 8]

$$G(s) = \frac{1}{T_2 s^2 + T_1 s + 1}, \quad G(j\omega) = \frac{1}{1 - \omega^2 T_2 + j\omega T_1}$$

$$\text{Gain} = 20\log_{10}\sqrt{\frac{1}{(1-\omega^2 T_2)^2 + (\omega T_1)^2}}$$

In this case, the number of the actuators of the nozzles through which ink drops are jetted is less than a predetermined value, and the frequency characteristics shown by the solid line is increased as shown by the chain double-dashed line of FIG. 26, the time constants $T_1$ and $T_2$ can be obtained by setting the gain of the secondary low-pass filter so that the gain at the two predetermined frequencies $f_1$ and $f_2$ will be a predetermined value, i.e., 0 in this case, and solving the equations. The time constants $T_1$ and $T_2$ can be expressed as follows, where the gains at a predetermined frequency frequencies $f_1$ and $f_2$ of the filter comprised of the low pass filter and the actuator are $G_1$ and $G_2$ respectively, $\omega_1 = 2\pi f_1$, and $\omega_2 = 2\pi f_2$:

[Equation 9]

$$20\log_{10}\sqrt{\frac{1}{(1-\omega_1^2 T_2)^2 + (\omega_1 T_1)^2}} + 20\log_{10}|G_1| = 0$$

$$20\log_{10}\sqrt{\frac{1}{(1-\omega_2^2 T_2)^2 + (\omega_2 T_1)^2}} + 20\log_{10}|G_2| = 0$$

$$\therefore (1-\omega_1^2 T_2)^2 + (\omega_1 T_1)^2 = G_1^2$$

$$(1-\omega_2^2 T_2)^2 + (\omega_2 T_1)^2 = G_2^2$$

The time constants $T_1$ and $T_2$ can be obtained by solving the above simultaneous equation.

In the present embodiment, only the example in which a head drive apparatus of an inkjet printer of the present invention is applied to a line head inkjet printer has been explained in detail, but a head drive apparatus of an inkjet printer of the present invention can be applied to any type of inkjet printer including a multipass printer.

What is claimed is:

1. A head drive apparatus of an inkjet printer, comprising:
   a plurality of nozzles provided to an inkjet head;
   a plurality of actuators provided corresponding to the nozzles; and
   a drive unit that applies a drive signal to the plurality of actuators, wherein
   the drive unit, includes:
   a drive waveform generator that generates a drive waveform signal as a reference of the drive signal;
   a modulator that pulse modulates the drive waveform signal to output a modulated signal;
   a digital power amplifier that amplifies power of the modulated signal to output an amplified signal;
   a low pass filter that smoothes the amplified signal and supplies the actuators the amplified signal as the drive signal; and
   an inverse filter provided in a subsequent stage of the drive waveform generator, wherein a frequency characteristic of the inverse filter, which is based on the capacitances of the actuators and the low pass filter, is corrected to a predetermined frequency characteristic based on a number of actuators to be driven derived from print data,
   wherein the predetermined frequency characteristic of the inverse filter is set as a function of the number of the actuators.

2. The head drive apparatus of an inkjet printer according to claim 1, wherein, when the number of the actuators exceeds a predetermined value, a high frequency emphasis filter is used, and when the number of the actuators is less than a predetermined value, a low-pass or high frequency attenuation filter is used.

3. An inkjet printer, comprising the head drive apparatus according to claim 1.

* * * * *